US012677628B2

(12) United States Patent
Yang et al.

(10) Patent No.: US 12,677,628 B2
(45) Date of Patent: Jul. 7, 2026

(54) ELECTRICAL CHARACTERIZATION OF MISALIGNMENT IN INTEGRATED CIRCUIT MANUFACTURING

(71) Applicant: Texas Instruments Incorporated, Dallas, TX (US)

(72) Inventors: Hao Yang, Allen, TX (US); John K. Arch, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 516 days.

(21) Appl. No.: 18/175,718

(22) Filed: Feb. 28, 2023

(65) Prior Publication Data

US 2024/0290641 A1 Aug. 29, 2024

(51) Int. Cl.
*H01L 21/67* (2006.01)
*H10D 62/10* (2025.01)

(52) U.S. Cl.
CPC ..... *H01L 21/67259* (2013.01); *H10D 62/115* (2025.01)

(58) Field of Classification Search
CPC ............. H01L 21/67259; H01L 23/488; H01L 23/5283; H01L 23/585; H01L 24/73; H01L 24/92; H01L 23/522; H01L 23/49838; H01L 24/24; H01L 24/19; H01L 23/5389; H01L 25/18; H01L 23/58; H01L 24/20; H01L 22/32; H01L 22/34; H01L 24/06; H01L 25/0655; H01L 23/48; H01L 23/5385; H01L 23/562; H01L 24/32; H01L 21/56; H01L 24/96; H01L 23/5286; H01L 23/5223; H01L 23/5227; H01L 23/544; H01L 24/13; H01L 24/11; H01L 2224/04105; H01L 2224/05571; H01L 2224/29186; H01L 2924/3512; H01L 2224/83896; H01L 2224/32145; H01L 2924/18162; H01L 2224/12105; H01L 2224/32265; H01L 2224/32059; H01L 2224/08145; H01L 2224/32137; H01L 2924/183; H01L 2223/5446; H10D 62/115; G01N 27/4145; G01N 27/4148; C12Q 1/6874

See application file for complete search history.

(56) References Cited

U.S. PATENT DOCUMENTS

| | | | |
|---|---|---|---|
| 6,236,101 B1 | 5/2001 | Erdeljac et al. | |
| 6,284,669 B1 | 9/2001 | Erdeljac et al. | |
| 7,112,953 B2 | 9/2006 | Chen et al. | |
| 8,748,976 B1 | 6/2014 | Kocon et al. | |
| 11,621,193 B2 * | 4/2023 | Sawada ................... | H01L 22/32 |
| | | | 257/668 |

(Continued)

*Primary Examiner* — Mouloucoulaye Inoussa
(74) *Attorney, Agent, or Firm* — Andrew R. Ralston; Frank D. Cimino

(57) ABSTRACT

A method includes performing a fabrication process that fabricates a wafer having an upper region and unit areas arranged in rows along a first direction and columns along an orthogonal second direction and respective scribe streets between adjacent unit areas to: form first and second electrical components on or in the upper region in respective unit areas or scribe streets, the first and second electrical components spaced apart from one another and including structural features with different respective first and second spacing distances along the first direction.

17 Claims, 28 Drawing Sheets

(56)  References Cited

U.S. PATENT DOCUMENTS

| | | | | |
|---|---|---|---|---|
| 11,626,377 B2 * | 4/2023 | Han | H01L 21/67253 | |
| | | | 257/48 | |
| 2004/0007755 A1 | 1/2004 | Jan et al. | | |
| 2005/0208684 A1 * | 9/2005 | Yamada | H01L 24/05 | |
| | | | 257/E21.525 | |
| 2006/0038553 A1 * | 2/2006 | Chen | H01L 22/34 | |
| | | | 324/762.05 | |
| 2009/0121337 A1 * | 5/2009 | Abe | H01L 21/268 | |
| | | | 257/E21.237 | |
| 2009/0272973 A1 * | 11/2009 | Yoshida | H01L 22/32 | |
| | | | 257/E23.179 | |
| 2011/0027917 A1 * | 2/2011 | Shinkawata | H10D 89/00 | |
| | | | 257/E21.531 | |
| 2012/0313094 A1 * | 12/2012 | Kato | H01L 23/585 | |
| | | | 257/E21.531 | |
| 2014/0319522 A1 * | 10/2014 | Daubenspeck | H01L 24/03 | |
| | | | 257/737 | |
| 2015/0200146 A1 * | 7/2015 | Reber | H01L 22/34 | |
| | | | 438/18 | |
| 2015/0371957 A1 * | 12/2015 | Wang | H01L 21/78 | |
| | | | 257/620 | |
| 2016/0064294 A1 * | 3/2016 | Reber | H01L 23/585 | |
| | | | 257/737 | |
| 2016/0079204 A1 * | 3/2016 | Matsubara | H01L 23/3128 | |
| | | | 438/114 | |
| 2018/0226364 A1 * | 8/2018 | Kim | H01L 23/49827 | |
| 2018/0240832 A1 * | 8/2018 | Iwafuchi | H01L 23/544 | |
| 2020/0058551 A1 * | 2/2020 | Bae | H01L 21/7806 | |
| 2020/0312715 A1 * | 10/2020 | Choi | H01L 21/76838 | |
| 2021/0327839 A1 * | 10/2021 | Han | H01L 23/544 | |
| 2021/0351269 A1 | 11/2021 | Hu et al. | | |
| 2021/0367030 A1 | 11/2021 | Selvaraj et al. | | |
| 2021/0384093 A1 * | 12/2021 | Verma | H01L 23/564 | |
| 2021/0391279 A1 * | 12/2021 | Sugioka | H10B 12/09 | |
| 2021/0407904 A1 * | 12/2021 | Liang | H01L 21/76805 | |
| 2022/0005733 A1 * | 1/2022 | Jeong | H01L 23/3171 | |
| 2022/0037268 A1 * | 2/2022 | Shen | H01L 23/585 | |
| 2022/0042943 A1 * | 2/2022 | Rothberg | G01N 27/4148 | |
| 2022/0093507 A1 | 3/2022 | Fernandes et al. | | |
| 2022/0130717 A1 | 4/2022 | Hu et al. | | |
| 2022/0199517 A1 * | 6/2022 | Dabral | H01L 23/522 | |
| 2022/0293433 A1 * | 9/2022 | Dabral | H01L 24/19 | |
| 2022/0336373 A1 * | 10/2022 | Yamaguchi | H01L 23/544 | |
| 2022/0344278 A1 * | 10/2022 | Yamaguchi | H01L 23/544 | |
| 2022/0359316 A1 * | 11/2022 | Chen | H01L 24/19 | |

* cited by examiner

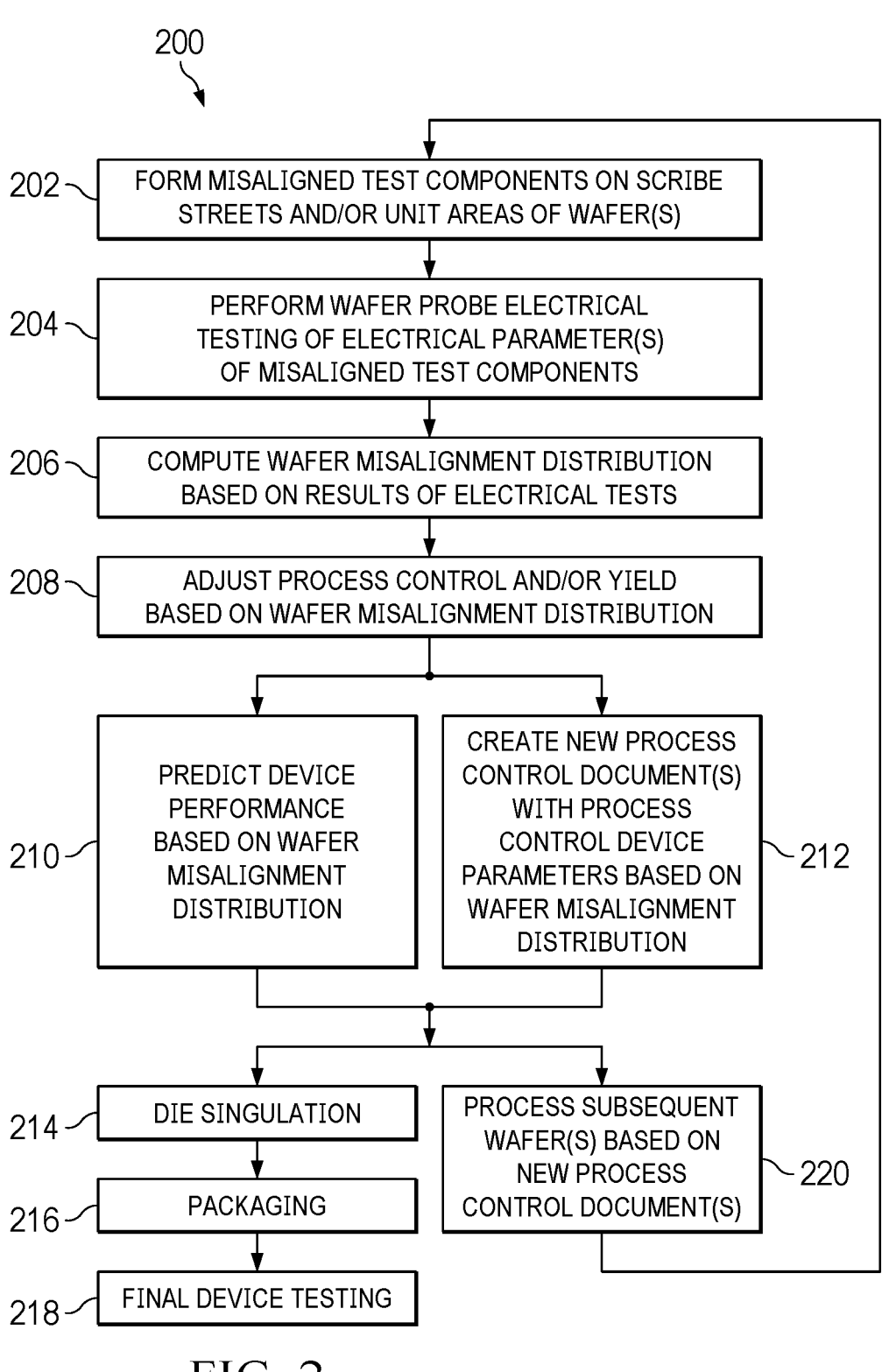

200

202 — FORM MISALIGNED TEST COMPONENTS ON SCRIBE STREETS AND/OR UNIT AREAS OF WAFER(S)

204 — PERFORM WAFER PROBE ELECTRICAL TESTING OF ELECTRICAL PARAMETER(S) OF MISALIGNED TEST COMPONENTS

206 — COMPUTE WAFER MISALIGNMENT DISTRIBUTION BASED ON RESULTS OF ELECTRICAL TESTS

208 — ADJUST PROCESS CONTROL AND/OR YIELD BASED ON WAFER MISALIGNMENT DISTRIBUTION

210 — PREDICT DEVICE PERFORMANCE BASED ON WAFER MISALIGNMENT DISTRIBUTION

212 — CREATE NEW PROCESS CONTROL DOCUMENT(S) WITH PROCESS CONTROL DEVICE PARAMETERS BASED ON WAFER MISALIGNMENT DISTRIBUTION

214 — DIE SINGULATION

216 — PACKAGING

218 — FINAL DEVICE TESTING

220 — PROCESS SUBSEQUENT WAFER(S) BASED ON NEW PROCESS CONTROL DOCUMENT(S)

FIG. 2

ELECTRICAL CHARACTERIZATION OF MISALIGNMENT IN INTEGRATED CIRCUIT MANUFACTURING

BACKGROUND

Electrical components, such as transistors in a packaged electronic device are affected by alignment of structural features created during wafer processing. Feature misalignment undesirable in semiconductor fabrication process control and misalignment in each unit area or shot can vary across a processed wafer. Inline measurements can be done to characterize misalignment, but this takes a lot of time and is not practical for every shot across the wafer.

SUMMARY

In one aspect, an electronic device includes a semiconductor die and a package structure, where the semiconductor die has a side that extends in a plane of orthogonal first and second directions, an upper region that extends along the side, and first and second electrical components on or in the upper region. The first and second electrical components are spaced apart from one another along the first direction and include structural features with different respective first and second spacing distances along the first direction.

In another aspect, an electronic device includes a device die including a semiconductor die substrate having a side that extends in a plane of orthogonal first and second directions, first and second electrical components, the first and second electrical components spaced apart from one another and including first and second structural features formed in or over the semiconductor substrate, the first structural feature in the first electrical component spaced apart from the second structural feature in the first electrical component by a first spacing distance, and a second electrical component nominally identical to the first electrical component and including the first and the second structural features formed in or over the semiconductor substrate, the first structural feature in the second electrical component spaced apart from the second structural feature in the second electrical component by a different second spacing distance.

In another aspect, a semiconductor wafer includes a side that extends in a plane of orthogonal first and second directions, an upper region that extends along the side, and an array of unit areas arranged in rows along the first direction and columns along the second direction and respective scribe streets between adjacent unit areas. At least some of the respective unit areas include first and second electrical components on or in the upper region. The first and second electrical components are spaced apart from one another along the first direction and include structural features with different respective first and second spacing distances along the first direction. The wafer includes wafer probe pads along the side and the wafer probe pads are connected to respective terminals of the first and second electrical components.

In a further aspect, a system includes a wafer and a tester. The wafer has a side that extends in a plane of orthogonal first and second directions, an upper region that extends along the side, and an array of unit areas arranged in rows along the first direction and columns along the second direction and respective scribe streets between adjacent unit areas. At least some of the respective unit areas or scribe streets include first and second electrical components on or in the upper region. The first and second electrical components are spaced apart from one another along the first direction and include structural features with different respective first and second spacing distances along the first direction. The wafer has wafer probe pads along the side that are connected to respective terminals of the first and second electrical components. The tester has probe pins adapted to engage the wafer probe pads of the respective unit areas or scribe streets. The tester is configured to electrically test an electrical performance parameter of the first and second electrical components, and to determine a misalignment distance of the respective unit areas or scribe streets along the first direction based on the electrical performance parameter of the first and second electrical components of the respective unit areas or scribe streets.

In another aspect, a method includes performing a fabrication process that fabricates a wafer having an upper region and unit areas arranged in rows along a first direction and columns along an orthogonal second direction and respective scribe streets between adjacent unit areas to: form first and second electrical components on or in the upper region in respective unit areas or scribe streets, the first and second electrical components spaced apart from one another and including structural features with different respective first and second spacing distances along the first direction.

In a further aspect, a method includes: forming an integrated circuit over and extending into a semiconductor substrate and including a device active region surrounded by a scribe seal; forming a first electrical component including first and second structural features in or over the semiconductor substrate, the first structural feature in the first electrical component spaced apart from the second structural feature in the first electrical component by a first spacing distance; and forming a second electrical component nominally identical to the first electrical component and including the first and the second structural features formed in or over the semiconductor substrate, the first structural feature in the second electrical component spaced apart from the second structural feature in the second electrical component by a different second spacing.

In another aspect, a method includes: forming an integrated circuit over and extending into a semiconductor substrate and including a device active region surrounded by a scribe seal; forming a first electrical component including first and second structural features in or over the semiconductor substrate, the first structural feature in the first electrical component spaced apart from the second structural feature in the first electrical component by a first spacing distance; forming a second electrical component nominally identical to the first electrical component and including the first and the second structural features formed in or over the semiconductor substrate, the first structural feature in the second electrical component spaced apart from the second structural feature in the second electrical component by a different second spacing; electrically testing an electrical performance parameter of the first and second electrical components; and determining a misalignment distance of the first structural features with respect to the second structure features based on the electrical performance parameter.

In a further aspect, an electronic device includes a plurality of instances of an electrical component over a semiconductor die, the plurality of instances each having same first and second structural features, the plurality of instances arranged in an array, a first instance of the electrical component having a first spacing distance between the first and second structural features, a second instance of the electrical component having a different second spacing distance between the first and second structural features, and a third instance of the electrical component having a different third spacing distance between the first and second structural features.

BRIEF DESCRIPTION OF THE DRAWINGS

FIG. 2 is a flow diagram of a method of fabricating an electronic device.

DETAILED DESCRIPTION

Figure 1:
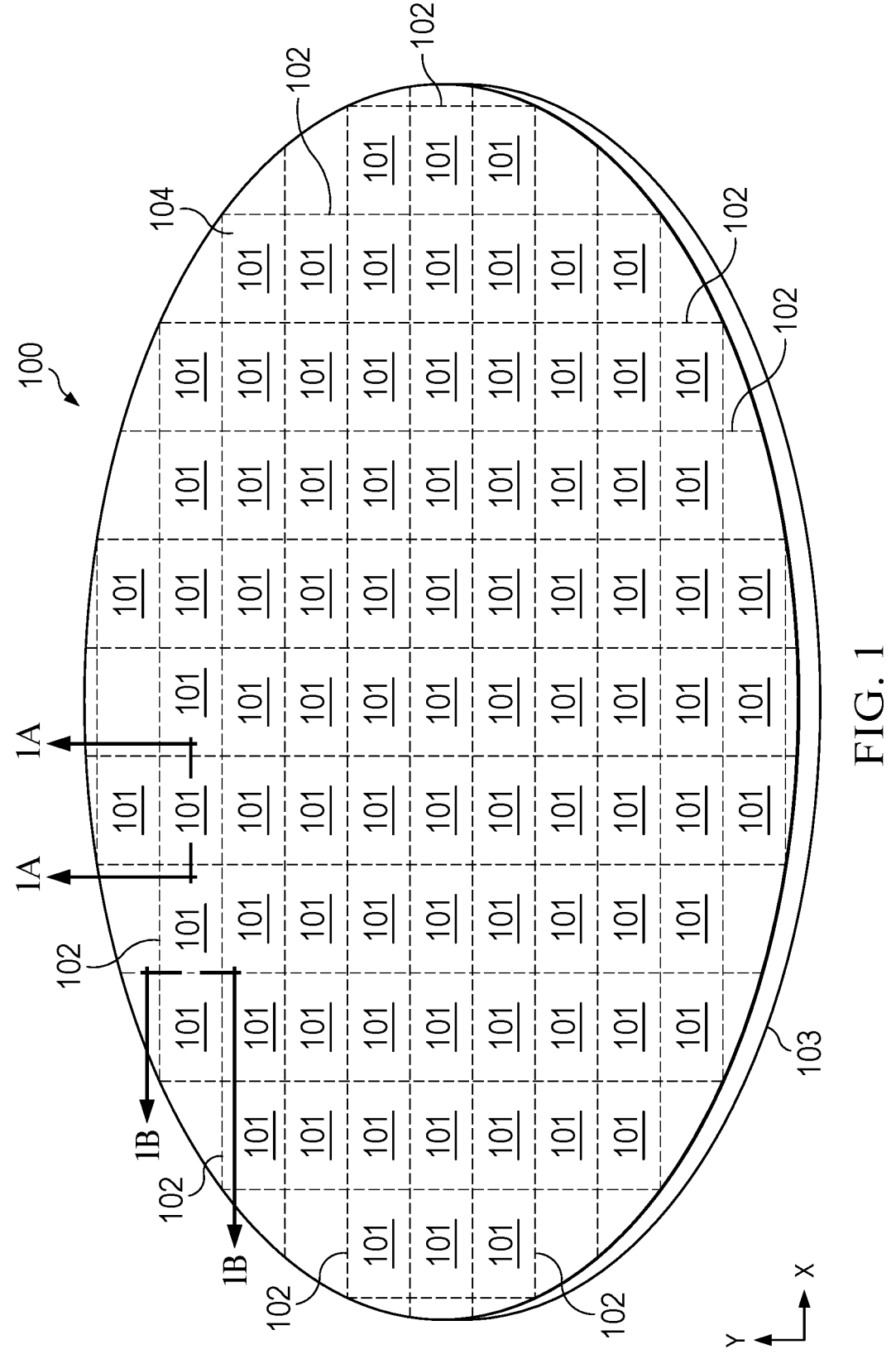
FIG. 1 is a top perspective view of a semiconductor wafer with rows and columns of unit areas and scribe streets.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Unless otherwise stated, "about," "approximately," or "substantially" preceding a value means+/−10 percent of the stated value and "substantially no" means zero or no measurable amount that reasonably affects quality or operation of a finished product or effectivity of a process. The example structures include layers or materials described as over or on another layer or material or surface, which can be a layer or material directly on and contacting the other layer or material or surface where other materials, such as impurities or artifacts or remnant materials from fabrication processing may be present between the layer or material and the other layer or material or surface.

Various disclosed devices and methods of the present disclosure may be beneficially applied to integrated circuits by providing test structures to characterize misalignment between patterned levels of such circuits that may occur during manufacturing. While such examples may be expected to provide improved process control, e.g. by providing feedback in photolithographic processes, no particular result is a requirement of the present invention unless explicitly recited in a particular claim.

Figure 1A:
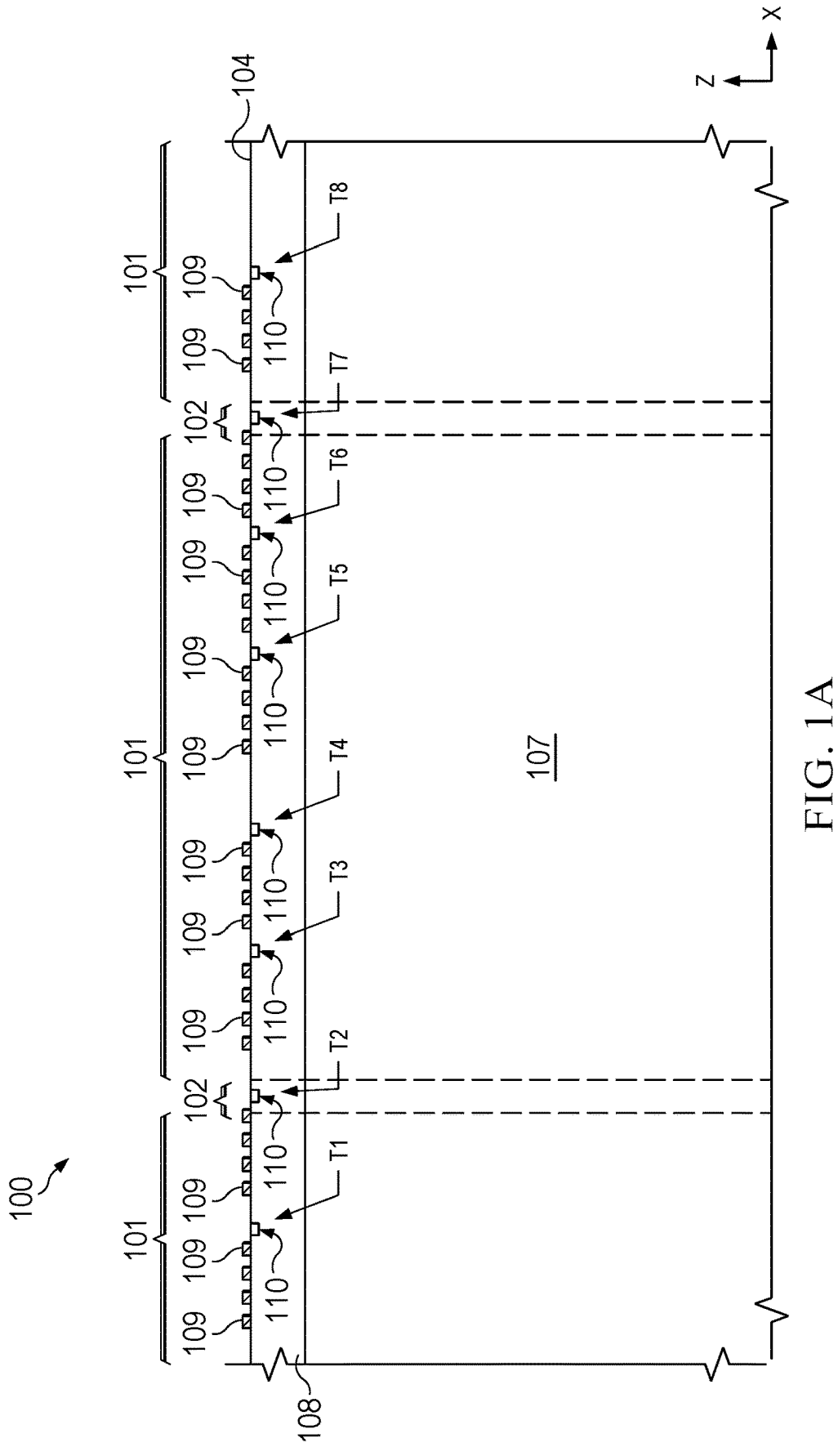
FIG. 1A is a partial sectional side elevation view of the semiconductor wafer taken along line 1A-1A of FIG. 1 with electrical components and wafer probe pads in unit areas of the wafer.
Figure 1B:
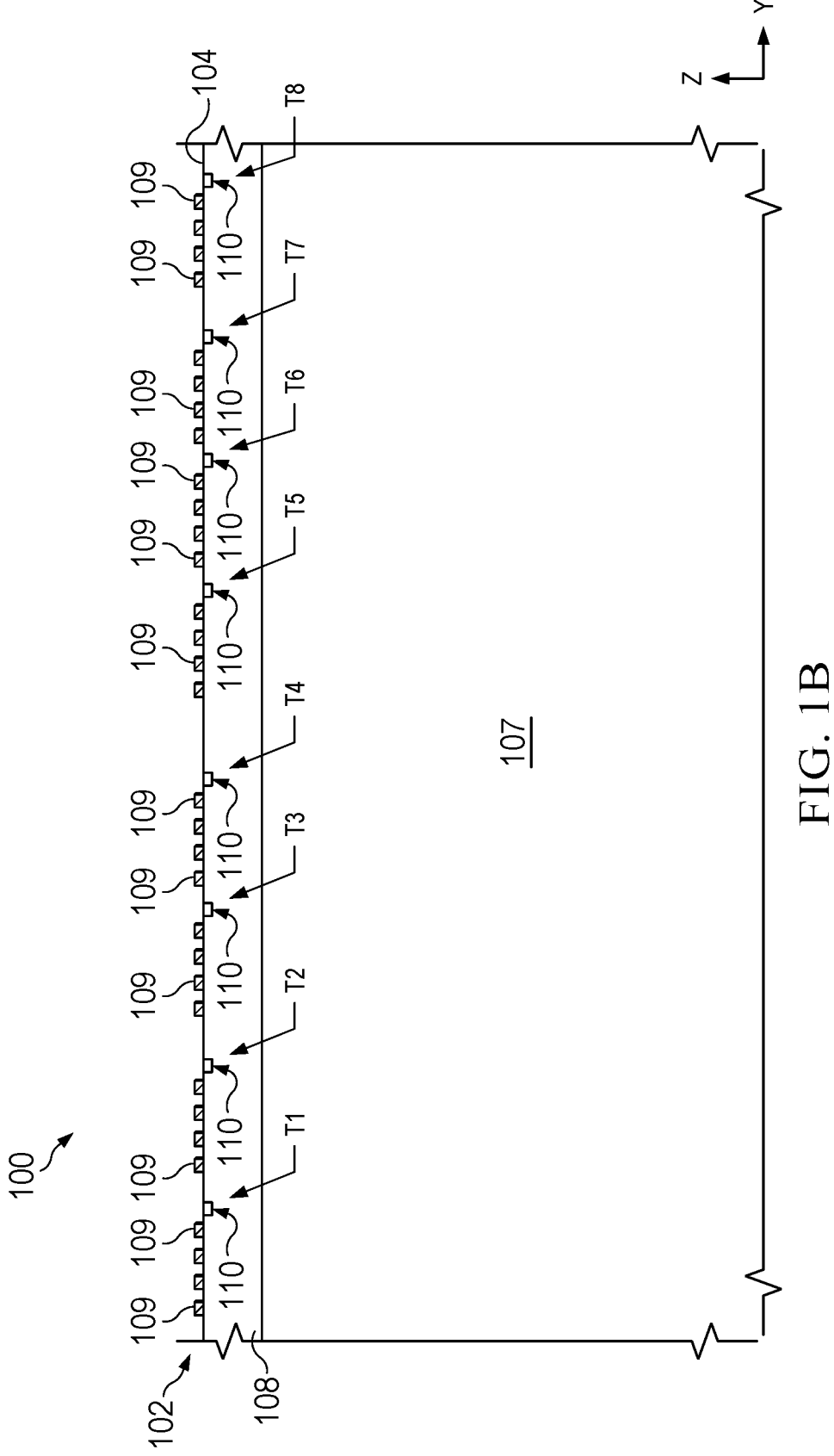
FIG. 1B is a partial sectional side elevation view of the semiconductor wafer taken along line 1B-1B of FIG. 1 with electrical components and wafer probe pads in a scribe street of the wafer.
Figure 1C:
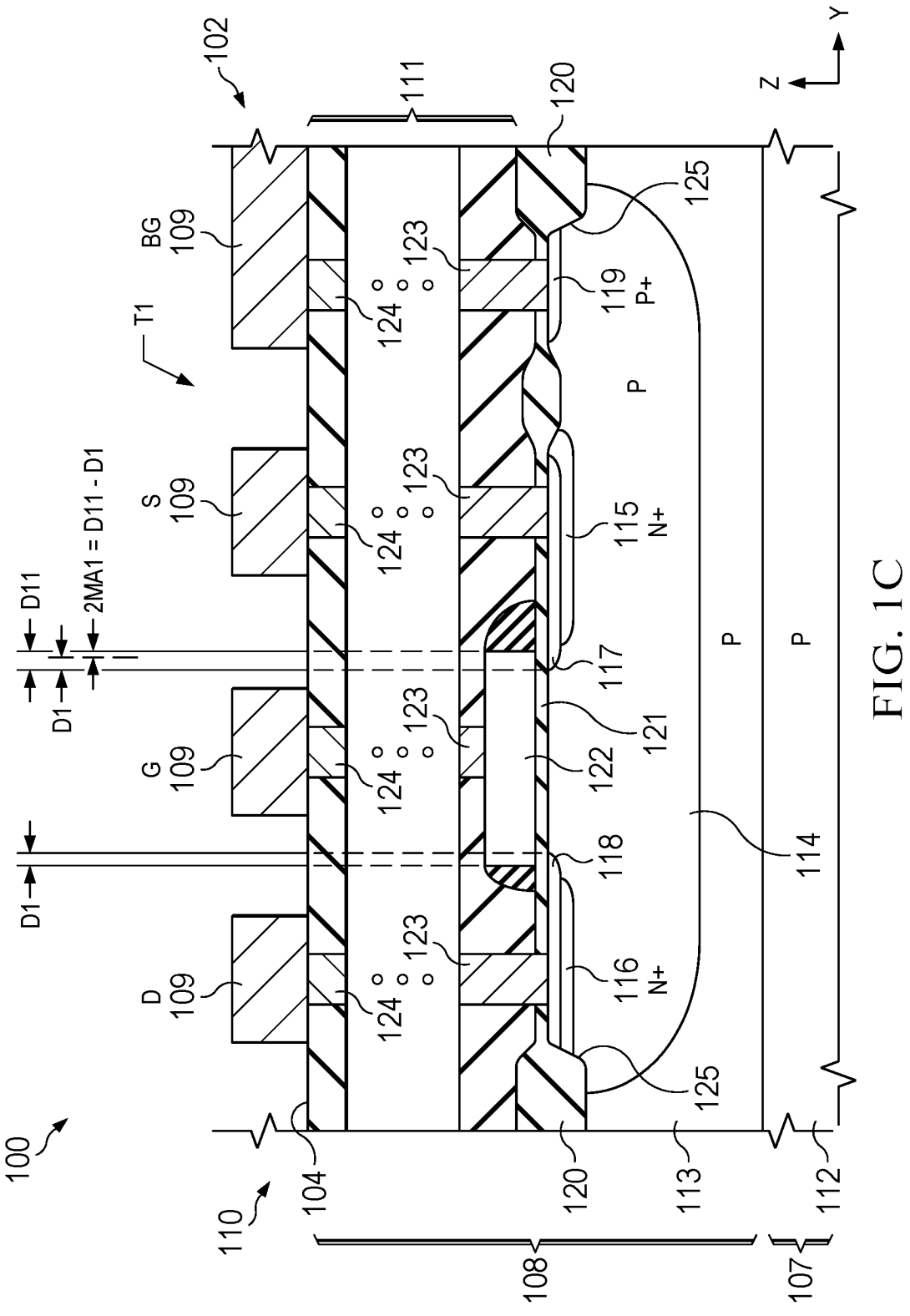
FIG. 1C is a partial sectional side elevation view of a transistor electrical component with intentional gate polysilicon to lightly doped drain misalignment and connections to wafer probe pads in the scribe street of the wafer.
Figure 1D:
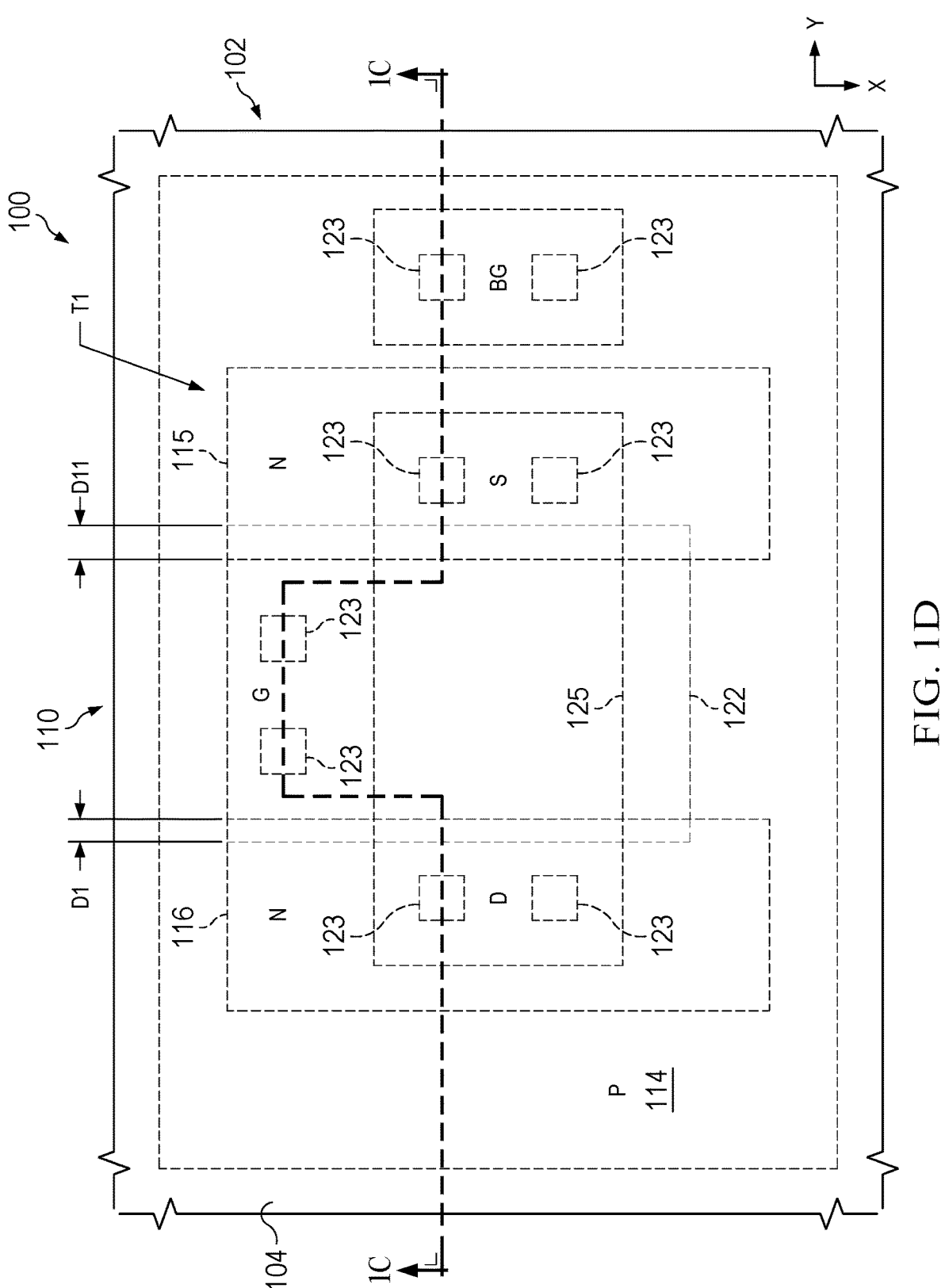
FIG. 1D is a partial top view of the transistor electrical component with intentional gate polysilicon to lightly doped drain misalignment and connections to wafer probe pads in the scribe street of the wafer.
Figure 1E:
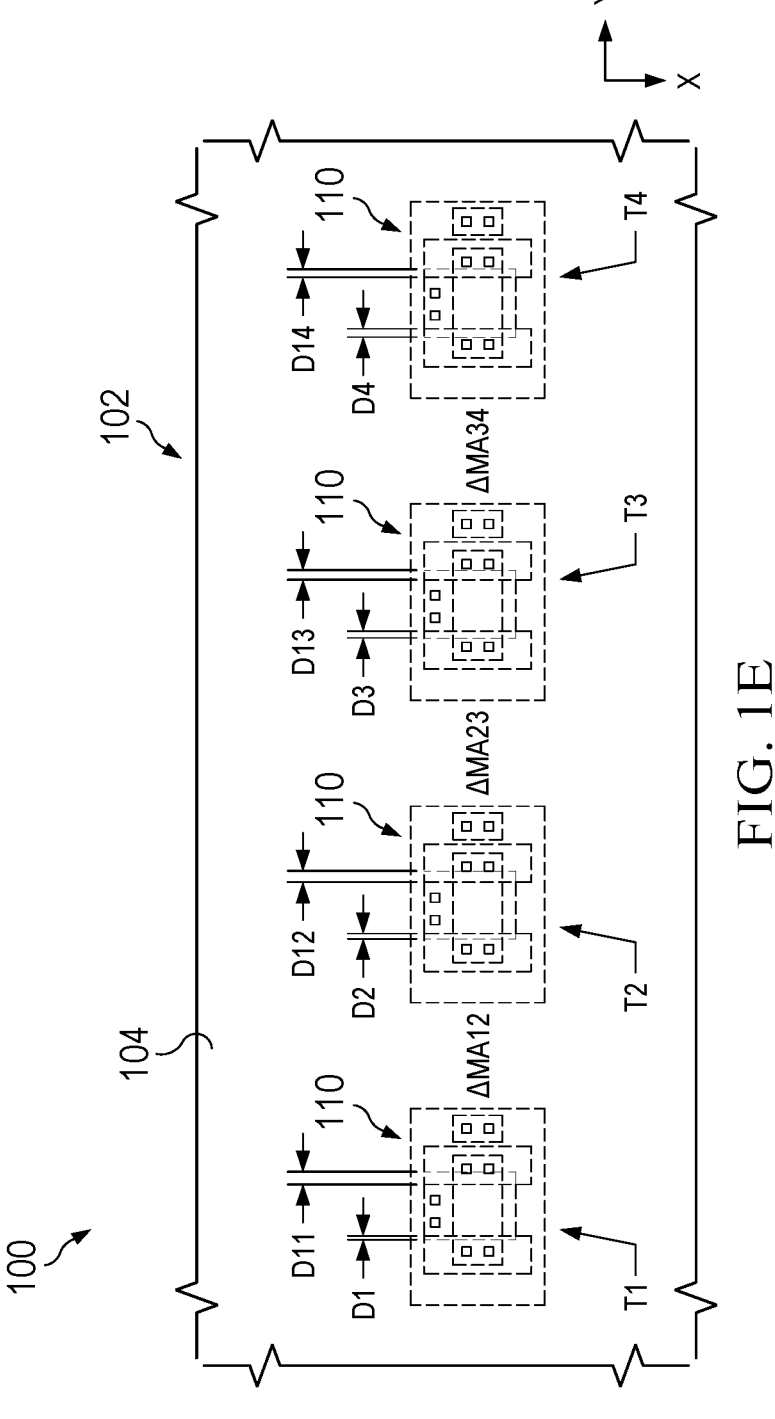
FIG. 1E is a partial top view of four transistor electrical components with different respective intentional gate polysilicon to lightly doped drain spacing distances in the scribe street of the wafer.
Figure 1F:
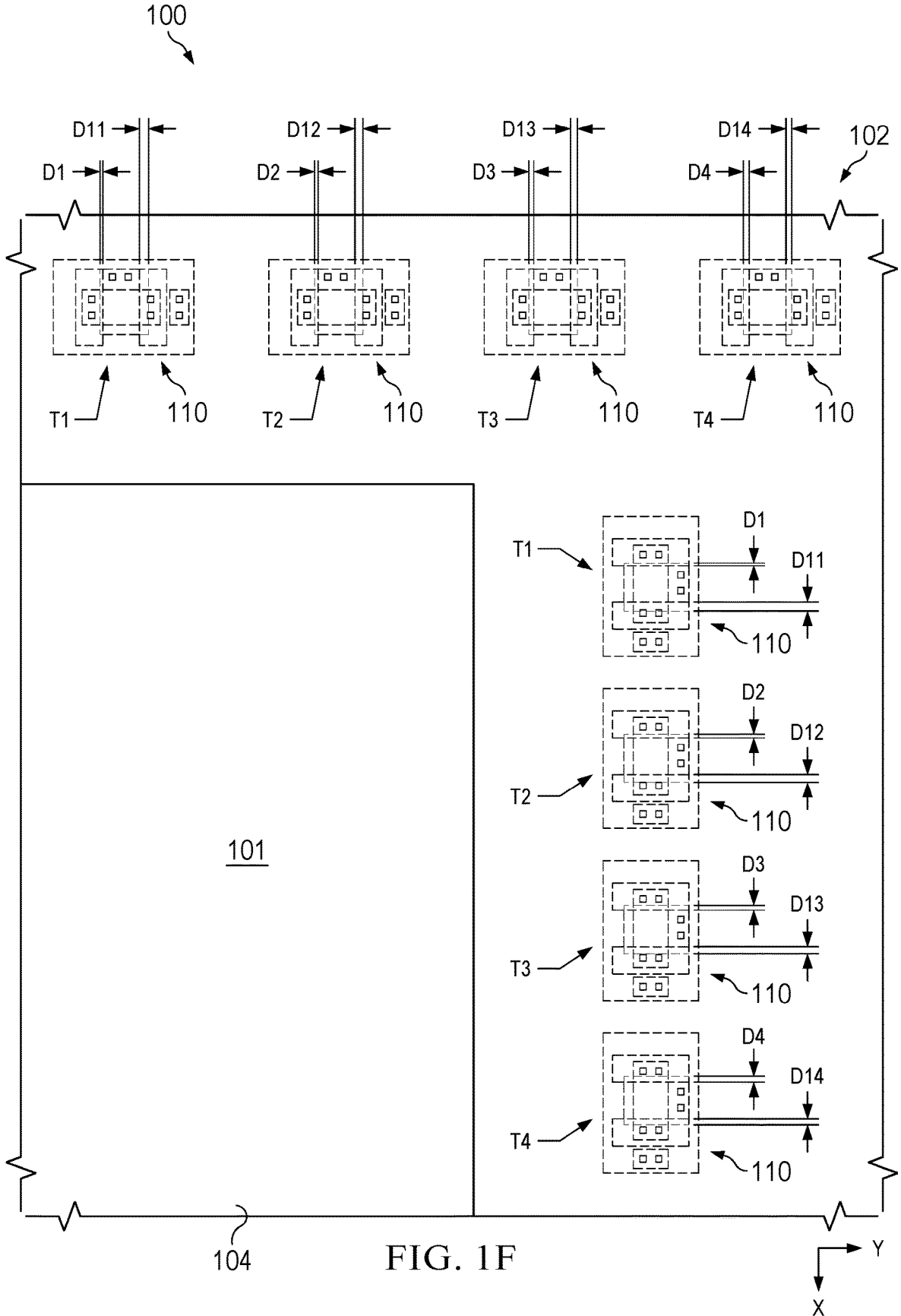
FIG. 1F is a partial top view of four transistor electrical components with different respective intentional gate polysilicon to lightly doped drain spacing distances along a first direction and four transistor electrical components with different respective intentional gate polysilicon to lightly doped drain spacing distances along an orthogonal second direction in the scribe street of the wafer.
Figure 1G:
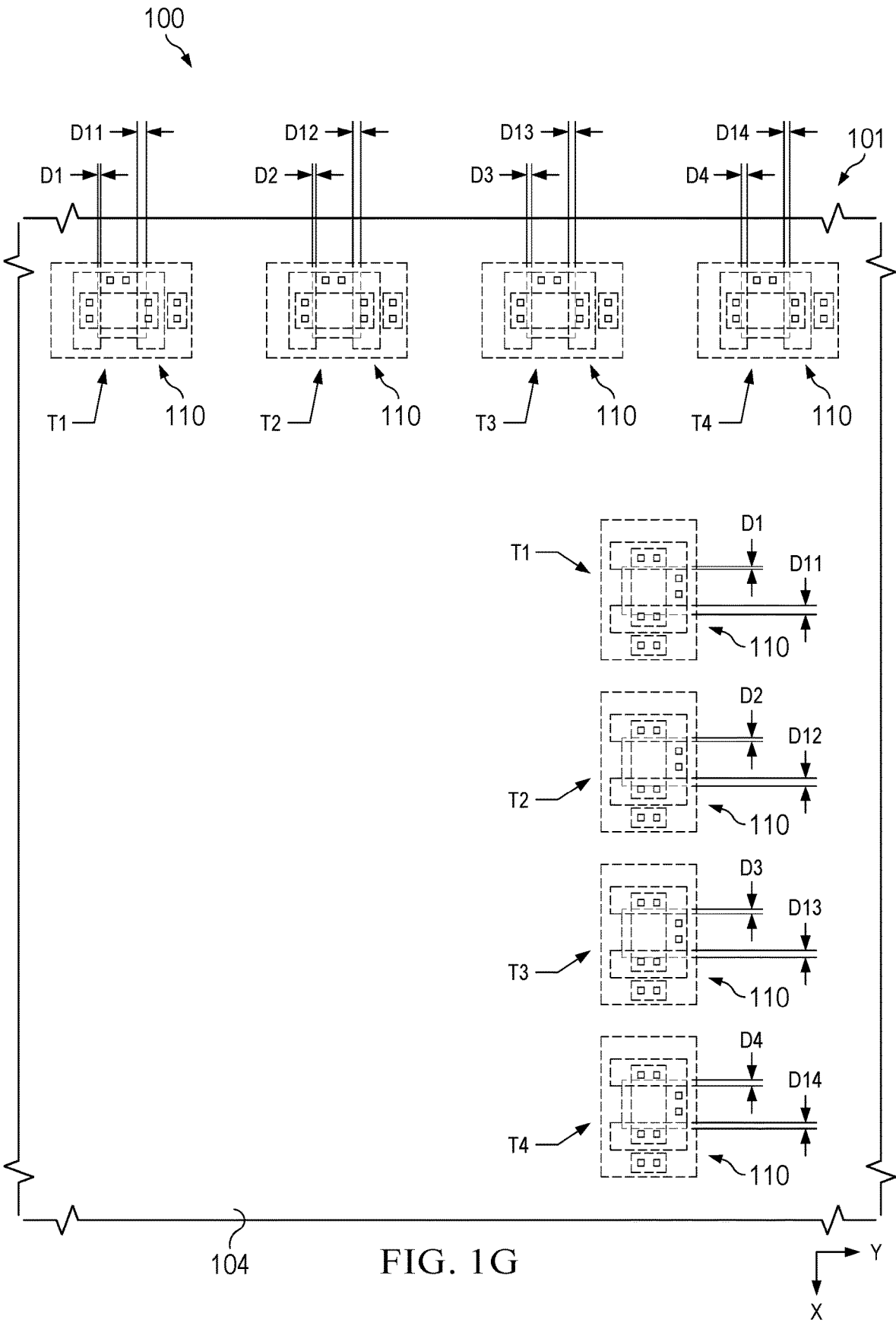
FIG. 1G is a partial top view of four transistor electrical components with different respective intentional gate polysilicon to lightly doped drain spacing distances along a first direction, and four transistor electrical components with different respective intentional gate polysilicon to lightly doped drain spacing distances along an orthogonal second direction in a unit area of the wafer.
Figure 1H:
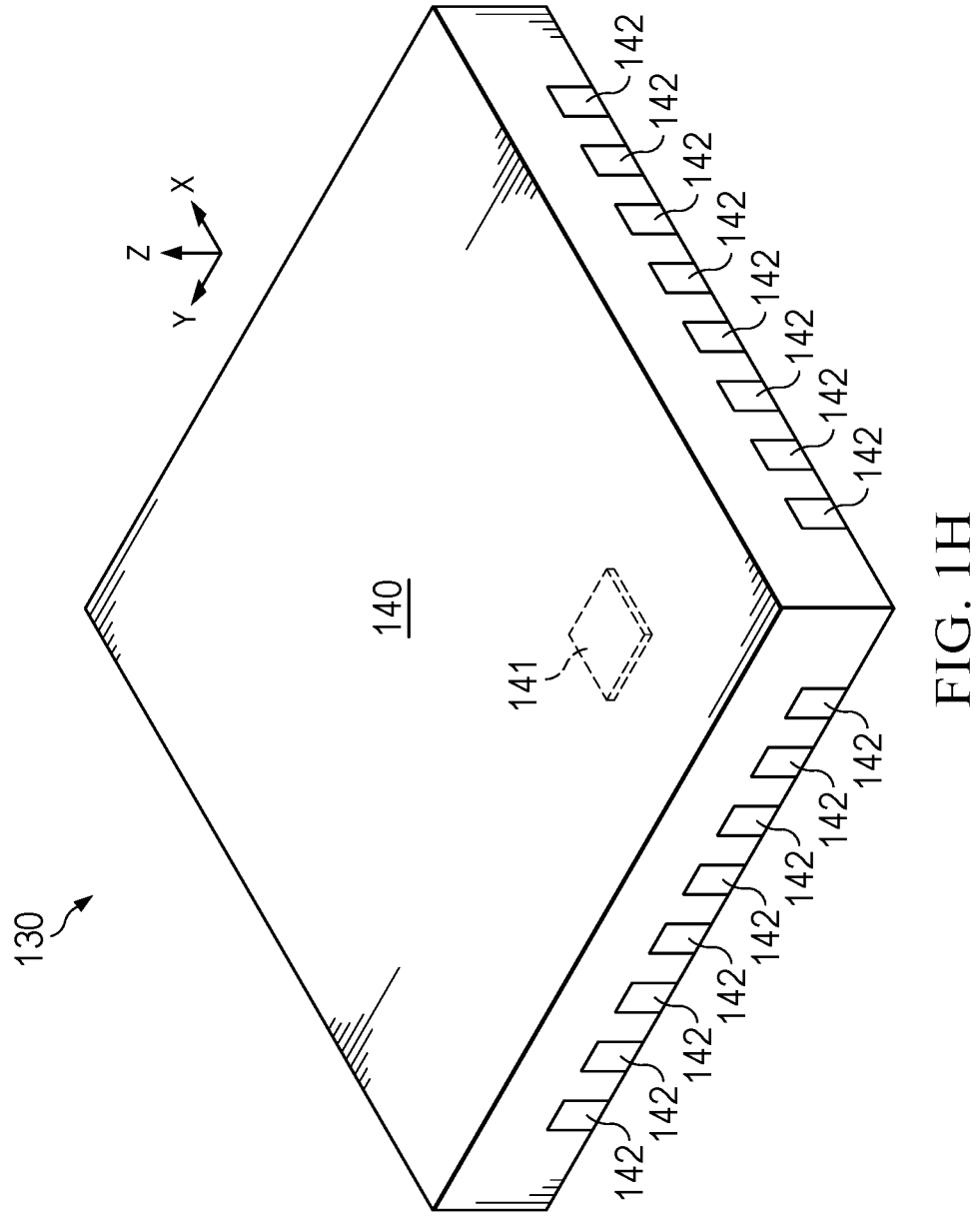
FIG. 1H is a perspective view of a packaged electronic device.

FIGS. 1-G and 1I-1K show an example semiconductor wafer 100 and FIG. 1H shows a packaged electronic device that includes a die of the wafer 100. The semiconductor wafer 100 is shown in an example position or orientation in a three-dimensional space with a first direction X, a perpendicular (orthogonal) second direction Y, and a third direction Z that is perpendicular (orthogonal) to the respective first and second directions X and Y, and structures or features along any two of these directions are orthogonal to one another. As shown in FIG. 1, the semiconductor wafer 100 includes an array of unit areas 101 arranged in rows along the first direction X and columns along the second direction Y. The unit areas 101 are subsequently separated from the wafer 100 to form semiconductor dies. The semiconductor wafer 100 has respective scribe streets 102 between adjacent unit areas 101. As best shown in FIG. 1, the semiconductor wafer 100 has opposite first and second (e.g., bottom and top) sides 103 and 104, respectively, which are spaced apart from one another along the third direction Z. The top side 104 extends in a plane of orthogonal first and second directions X and Y.

As further shown in FIGS. 1A and 1B, the wafer 100 has a base region 107 and an upper region 108 that extends along the side 104. The base region 107 in one example is or includes silicon, gallium nitride (GaN) or other semiconductor material. In one implementation, the base region 107 is or includes a silicon on insulator (SOI) structure. The upper region in one example includes silicon, gallium nitride (GaN) or other semiconductor material on or in which one or more electrical components are formed as well as an overlying single or multilevel metallization structure with one or more dielectric layers (e.g., $SiO_2$) and patterned conductive metal signal routing structures (e.g., copper, aluminum, etc.). The wafer 100 also has wafer probe pads 109 that are exposed for wafer probe testing along the top side 104, and electrical components 110. The electrical components 110 can be any electrical component type that has an electrical performance parameter that is affected by feature misalignment caused by one or more semiconductor fabrication processing steps. Non-limiting examples of such semiconductor fabrication processing steps include masking, patterning, exposure, etching, implantation, etc. In the illustrated example, the electrical components are transistors. Non-limiting examples of other types of electrical components include diodes, triodes, resistors, inductors, capacitors, etc.

The wafer probe pads 109 are electrically coupled through the metallization level or levels to provide electrical connections to terminals of associated ones of the electrical components 110 that may be probed for electrical testing to determine feature misalignment. FIG. 1A shows a partial sectional view of the semiconductor wafer 100 taken along line 1A-1A of FIG. 1 with eight transistor electrical components 110 labeled T1-T8 and associated wafer probe pads 109 in unit areas 101 of the wafer. The electrical components 110 in this example are formed on or in the upper region 108 of the wafer 100 and are spaced apart from one another along the first direction X. FIG. 1B shows another portion of the semiconductor wafer taken along line 1B-1B of FIG. 1 with eight transistor electrical components 110 labeled T1-T8 and associated wafer probe pads 109 in a scribe street 102 of the wafer 100. In the illustrated wafer 100, the unit areas 101 and the adjacent scribe streets 102 both include corresponding groups of transistor electrical components 110 arranged along the first and second directions X and Y. In various implementations, two or more electrical components 110 are provided in respective unit areas 101 or scribe streets 102 with different amounts of intentional misalignment of one or more component features and are connected to corresponding wafer probe pads 109 to allow wafer probe electrical testing of one or more operational parameters thereof to assess misalignment along a respective direction of the wafer 100.

In the illustrated example, a set of eight transistor electrical components 110 and associated wafer probe pads 109 are spaced apart from one another along the first direction X in each unit area 101 (e.g., FIG. 1A), and a second set of eight transistor electrical components 110 and associated wafer probe pads 109 are spaced apart from one another along the second direction Y in each unit area 101. In this example, moreover, one or both scribe streets 102 laterally adjacent each unit area 101 have a respective set of eight transistor electrical components 110 and associated wafer probe pads 109 spaced apart from one another along the second direction Y, and one or both scribe streets 102 above and below each unit area 101 have a respective set of eight transistor electrical components 110 and associated wafer probe pads 109 spaced apart from one another along the second direction Y (e.g., FIG. 1B). In the finished electronic device (e.g., FIG. 1H below), in one example, one or more of the electrical components 110 in the scribe street 102 may be partially or fully removed by sawing or laser cutting during die singulation and may not remain in the finished electronic device, whereas the electrical components 110 and the associated wafer probe pads 109 remain in the unit area 101 of the singulated semiconductor die in the finished electronic device.

As further shown in FIG. 1C, the individual transistor electrical components 110 include structural features with different respective first and second spacing distances along the first direction X. The electrical components 110 in various implementations include groups of two or more electrical components 110 with intentionally misaligned features along the spacing direction, such as along the first direction X in the example of FIG. 1A. In this example, the group of eight transistor electrical components 110 T1-T8 have eight different intentionally designed spacing distances between gate polysilicon and lightly doped drain. In these or other implementations, other feature spacing distances can be used with intentionally designed different values, such as gate polysilicon (or gate electrode) to drain/source contact spacing distances (e.g., FIG. 1I below), well edge to moat edge spacing distances (e.g., FIG. 1J), moat edge to drain/ source contact distances (FIG. 1K), etc. In the illustrated examples, the wafer probe pads 109 are connected to respective terminals (gate G, source S, drain D, and back gate BG) of the respective transistor electrical components 110.

FIG. 1C shows further details of one example implementation of an n-channel transistor T1 of the wafer 100, which includes a multilevel metallization structure 111 that extends to the top side 104 in the upper region 108 of the scribe street 102. In this example, the base region 107 is or includes a p-type silicon substrate 112. Epitaxial silicon extends above the silicon substrate 112 and includes a moderately doped p-type epitaxial silicon region 113 and a more highly doped shallow p-well 114 laterally interfacing the epitaxial silicon region 113 at "shallow well edges". The transistor T1 in FIG. 1C is representative of the other transistor electrical components 110 in one example and includes an n-type source implanted region 115 and an n-type drain implanted region 116 in the shallow p-well 114, as well as an n-type lightly doped drain (LDD) region 117 partially in the source implanted region 115 and an n-type LDD region 118 partially in the drain implanted region 116. A further p-type heavily doped region 119 is formed in the shallow p-well 114 spaced laterally outward of the source implanted region 115 to provide a back gate connection for the transistor. Isolation structures 120 (shallow trench isolation (STI) as shown or Local Oxidation of Silicon (LOCOS) provide lateral isolation and a thin gate oxide 121 extends over a channel portion of the transistor T1 in the shallow p-well 114. A polysilicon gate structure 122, sometimes referred to as a gate electrode, extends on the gate oxide 121 above the channel, and conductive metal (e.g., tungsten) contacts extend to source, drain, gate, and back gate terminals of the transistor T1. Sides or edges 125 of the isolation structures 120 nearest the gate structure 122 enclose a moat region and may this be termed "moat edges" 125. Vertical interconnects (or contacts) provide a direct connection to the drain implanted region 116, the source implanted region 115, the doped region 119 and the gate 122. The multilevel metallization structure 111 includes one or more levels and an upper most level has conductive metal features 124 that provide electrical connection to the wafer probe pads 109 to allow probe testing to access the drain (D), source (S), gate (G) and back gate (BG) of the transistor T1 along the top side 104.

As shown in FIGS. 1C and 1D, the transistor electrical component 110 has intentional misalignment of the gate polysilicon to lightly doped drain spacing along the second direction Y. In this example, the Y direction spacing between the left most end of the polysilicon gate structure 122 and the right most end of the drain side n-type LDD region 118 is a first spacing distance labeled D1, and the Y direction spacing between the right most end of the polysilicon gate structure 122 and the left most end of the source side n-type LDD region 117 is a spacing distance labeled D11, where D11 is greater than D1. As further indicated in FIG. 1C, moreover, the misalignment MA along the second direction Y in this example is (D11−D1)/2. The transistor T1 is designed with intentional misalignment of the gate polysilicon to lightly doped drain spacing along the second direction Y with design values of D1 and D11 that are not equal. The actual distances D1 and D11 can deviate from the intentionally misaligned design values along the second direction Y due to process variations. Such process variations can be detected by deviations in electrical performance of multiple instances of the transistor electrical component 110 having different respective spacing distances during wafer probe testing.

As further shown in FIGS. 1E-1G, the example wafer 100 includes a set of eight transistor electrical components 110 spaced apart from one another along the first direction X with different spacing distances along the first direction X, and may also have a set of eight transistor electrical components 110 spaced apart from one another along the second direction Y with different spacing distances along the second direction Y in at least some of the unit areas 101 and in at least some of the corresponding adjacent scribe streets 102.

FIG. 1E shows a top view of four instances of a transistor electrical component 110 of such a set (e.g., T1-T4 of the set of transistors T1-T8 in FIG. 1B above). The transistor component instances T1-T4 are spaced apart from one another along the second direction Y and have different respective intentionally misaligned gate polysilicon to lightly doped drain spacing distances D1, D11; D2, D12; D3, D13; and D4, D14 along the second direction Y in the illustrated scribe street 102 of the wafer 100. In the illustrated example, the first transistor T1 has a first spacing distance D1 between the first and second structural features (e.g., the Y direction spacing between the left most end of the polysilicon gate structure 122 and the right most end of the drain side n-type LDD region 118). The second instance T2 of the transistor electrical component 110 has a different (e.g., larger) second spacing distance D2 (between the left most end of the polysilicon gate structure 122 and the right most end of the drain side n-type LDD region 118). In this example, the different in the first and second spacing distances (e.g., D2−D1) is a first misalignment difference value ΔMA12.

The third instance T3 of the of the transistor electrical component 110 in this example has a different (e.g., still larger) third spacing distance D3, and the fourth instance T4 of the of the transistor electrical component 110 in FIG. 1E has a different (e.g., even larger) fourth spacing distance D4. The second and third spacing distances D2 and D3 differ by a second misalignment difference value ΔMA23, and the first and second misalignment difference values ΔMA12 and ΔMA23 are different. The third and fourth spacing distances D3 and D4 differ by a third misalignment difference value ΔMA34, and the first, second and third misalignment difference values ΔMA12, ΔMA23 and ΔMA34 are different from one another. In another implementation, one or more pairs of the misalignment difference values can be the same. In the illustrated example, moreover, the Y direction spacing distance D11 between the right most end of the polysilicon gate structure 122 and the left most end of the source side n-type LDD region 117 of the first instance T1 of the transistor electrical component 110 is greater than the second spacing distance D12 of the second instance T2, and the spacing distances D13 and D14 of the respective third and fourth instances T3 and T4 of the transistor electrical component 110 are successively smaller.

The transistors T1-T4 (as well as T5-T8) are nominally identical. Herein. "nominally identical" with respect to the electrical components 110 is defined as meaning each of the electrical components includes the same physical features having same general physical interrelationships and performs a same electrical function. The physical distances between and among the various physical features is the same within normally expected process tolerances and variation for each of the components 110, except that the spacing between one physical feature and one or more remaining physical features within the electrical components is different from a first one and a second one of the electrical components 110, between the second one and a third one of the electrical components, etc. Thus the electrical components 110 of an N-member array may all be nominally identical while the distance between two particular physical features has N different values in the array.

FIG. 1F shows four instances of a transistor electrical components 110 (labeled T1-T4) with different respective intentional gate polysilicon to lightly doped drain spacing distances D1, D2, D3, D4 and D11, D12, D13, D14 along the first direction X and four transistor electrical components (labeled T1-T4) with different respective intentional gate polysilicon to lightly doped drain spacing distances D1, D2, D3, D4 and D11, D12, D13, D14 along the second direction Y in a scribe street 102 of the wafer 100. The scribe street is set apart from the corresponding unit area 101, or device active region, by a scribe seal.

FIG. 1G shows four transistor electrical components 110 (labeled T1-T4) with different respective intentional gate polysilicon to lightly doped drain spacing distances D1, D2 along the first direction X, and four transistor electrical components 110 (labeled T1-T4) with different respective intentional gate polysilicon to lightly doped drain spacing distances D1, D2 along the second direction in a unit area 101 of the wafer 100.

In these example portions of corresponding sets of eight transistor spaced from one another along the first direction X, the spacing distance D2 is greater in the second transistor T2 than the spacing distance D1 of the first transistor instance T1, while the spacing distance D12 in the second transistor T2 is less than the spacing distance D11 in the first transistor T1, and the other transistors T3-T8 have progressively larger spacing distances D1, D2, D3, D4, . . . and progressively smaller spacing distances D11, D12, D13, D14, . . . . In the illustrated portion of the set, the third and fourth transistor electrical components 110 (labeled T3 and T4) are spaced apart from one another along the first direction X and include structural features with different respective third and fourth spacing distances D3, D4 and D13, D14 along the first direction X. In one implementation, the same is true of transistor sets spaced from one another along the second direction Y, and the same is true of the sets of transistor electrical components 110 in the unit areas 101 and in the scribe streets 102 of the wafer. Any suitable number of two or more electrical components 110 can be used in individual sets, spaced apart from one another and including structural features with different respective first and second spacing distances along a respective direction, in either or both the unit areas 101 and/or scribe streets 102 of the wafer 100.

FIG. 1H shows an example packaged electronic device 130 with a package structure 140 (e.g., molded plastic, ceramic, etc.) that encloses a portion of a semiconductor die 141 singulated or separated from a corresponding unit area 101 of the wafer 100. The semiconductor die 141 of the electronic device 130 may include at least one set having two or more electrical components 110 as described above in the unit area 101, and/or may include a remnant scribe street 102 or portion thereof having a set with two or more electrical components 110 as described above.

Figure 1I:
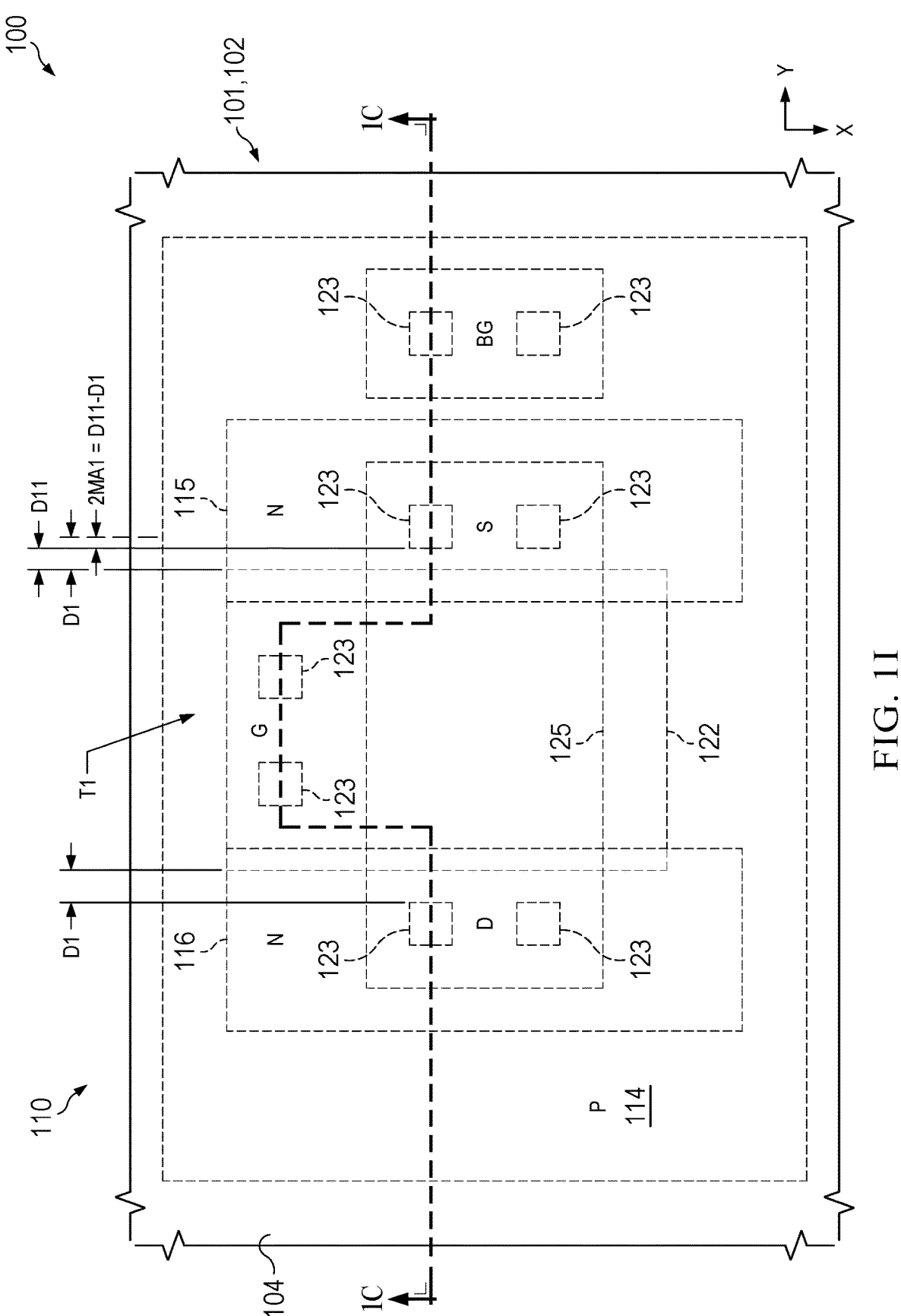
FIG. 1I is a partial top view of a transistor electrical component with intentional gate polysilicon or gate electrode to drain/source contact edge misalignment.
Figure 1J:
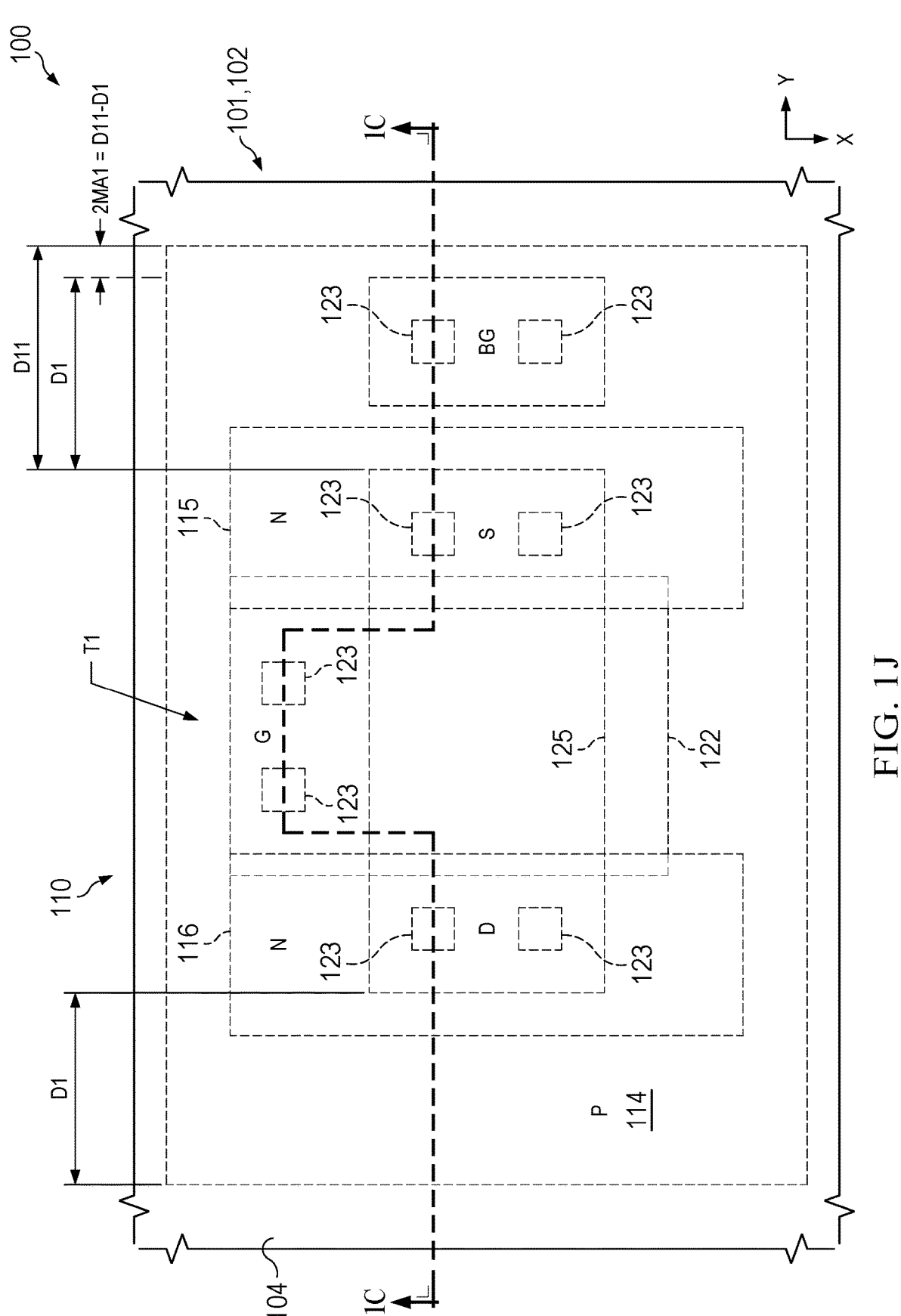
FIG. 1J is a partial top view of a transistor electrical component with intentional well edge to moat edge misalignment.
Figure 1K:
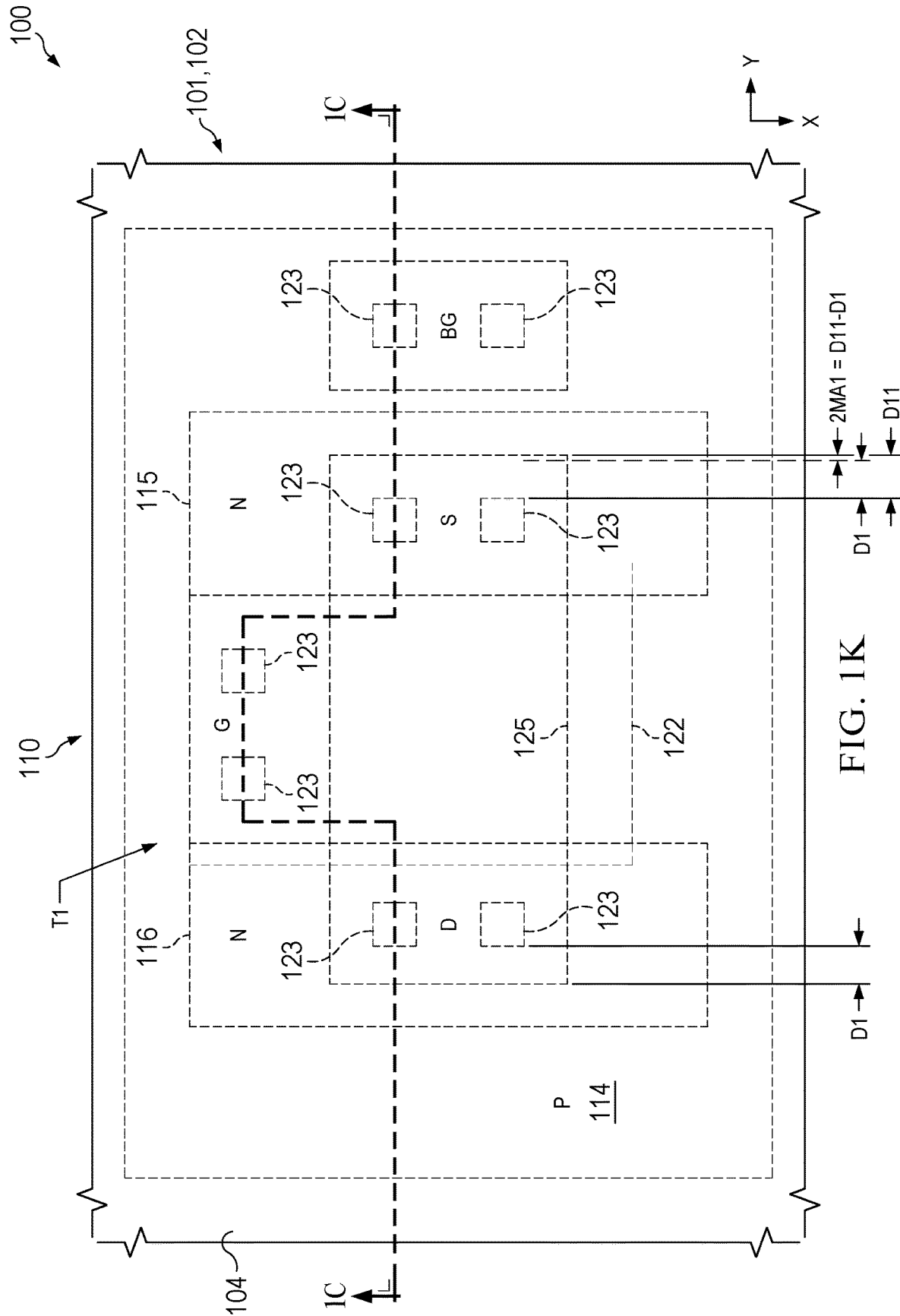
FIG. 1K is a partial top view of a transistor electrical component with intentional moat edge to drain/source contact misalignment.

FIGS. 1I-1K show further non-limiting examples of sets of two or more transistor electrical components 110. In these examples, different structural features of different instances of transistor electrical components 110 are intentionally misaligned with different respective first and second spacing distances along a respective direction, in either or both the unit areas 101 and/or scribe streets 102 of the wafer 100.

FIG. 1I shows a top view of a transistor electrical component 110 of the wafer 100 with intentionally misaligned gate polysilicon or gate contact to source/drain contact spacing distances along the channel direction of the transistor labeled T1. This example includes two or more such transistors with different respective first and second gate polysilicon to contact spacing distances along the second direction Y. In this example, the Y direction spacing between the left most end of the polysilicon gate structure 122 and the right most end of the drain contact 123 is a first spacing distance labeled D1, and the Y direction spacing between the right most end of the polysilicon gate structure 122 and the left most end of the source contact 123 is a second spacing distance labeled D11. In this example, D11 is greater than D1 and the intentional misalignment MA along the second direction Y in this example is (D11–D1)/2. The illustrated transistor instance T1 is designed with intentional misalignment of the gate polysilicon to moat edge distance along the second direction Y with design values of D1 and D11 that are not equal. The actual distances D1 and D11 can deviate from the intentionally misaligned design values along the second direction Y due to process variations during wafer processing. Sets of two or more instances of a transistor electrical component 110 (e.g., eight in one implementation) can be used with different respective gate polysilicon to contact spacing distances along the second direction Y and/or along the first direction X, in either or both the unit areas 101 and/or scribe streets 102 of the wafer 100.

FIG. 1J shows a partial top view of a transistor electrical component instance T1 with intentionally misaligned shallow p-well 114 to moat edges 125 D1 and D11, where D11 is greater than D1. FIG. 1K shows a partial top view of a transistor electrical component instance T1 with intentionally misaligned moat edges 125 to contact 114 D1 and D11, where D11 is greater than D1. In these examples two or more such instances of the transistor electrical component 110 are spaced apart from one another and have different spacing distances along the second direction Y.

Figure 1L:
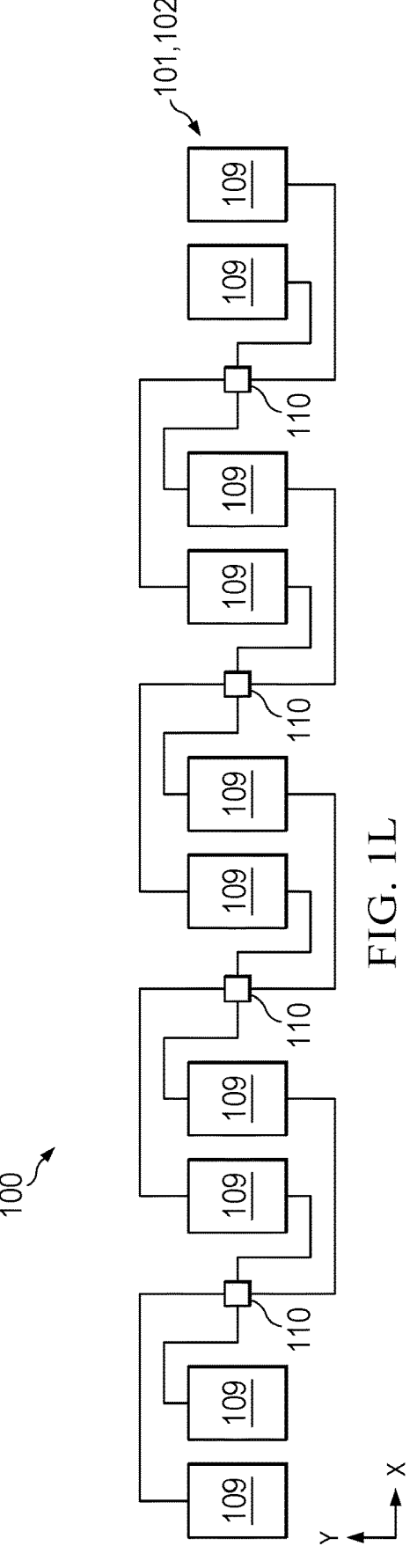
FIG. 1L is a partial top view of a set of transistor electrical components with connections to shared wafer probe pads of the wafer.

FIG. 1L shows a partial top view of a set of four instances of a transistor electrical component 110 with connections to shared wafer probe pads 109 in the wafer 100. As in the above described example, the instances of the transistor electrical component 110 can be located in a unit area 101 or a scribe street 102 of a wafer or subsequently separated semiconductor die 141, and the instances of the transistor electrical component having first and second structural features with different respective spacing distances between the first and second structural features.

Referring also to FIGS. 2-5C, FIG. 2 shows a method 200 of fabricating an electronic device, such as the electronic device 130 in FIG. 1H above. The method 200 includes performing a fabrication process at 202 that fabricates a wafer 100 having an upper region 108 and an array of unit areas 101 arranged in rows and columns along the respective first and second directions X and Y, as well as respective scribe streets 102 between adjacent unit areas 101. The fabrication process at 202 forms first and second electrical components (e.g., transistor electrical components 110 above, diodes, resistors, capacitors, inductors, etc.) on or in the upper region 108 in respective unit areas 101 or scribe streets 102 of the wafer, with the first and second electrical components 110 spaced apart from one another and including structural features with different respective first and second spacing distances along the first direction X. The fabrication process at 202 also forms wafer probe pads (e.g., wafer probe pads 109 above) along a side (e.g., 104) of the wafer 100 and connected to respective terminals (e.g., G, S, D, BG) of the first and second electrical components 110 of the respective unit areas 101 or scribe streets 102.

The method 200 includes wafer probe electrical testing at 204 to electrically test an electrical performance parameter of the first and second electrical components 110 of the respective unit areas 101 or scribe streets 102. Any suitable electrical performance parameter of the electrical components 110 can be tested at 204, including without limitation resistance of resistor components, capacitance or leakage current of capacitor components, inductance of inductor components, threshold voltage, drain-source on-state resistance, drive current, substrate back gate current ISB or other parameter of transistor components, reverse voltage breakdown voltage of diode components, etc.

Figure 3:
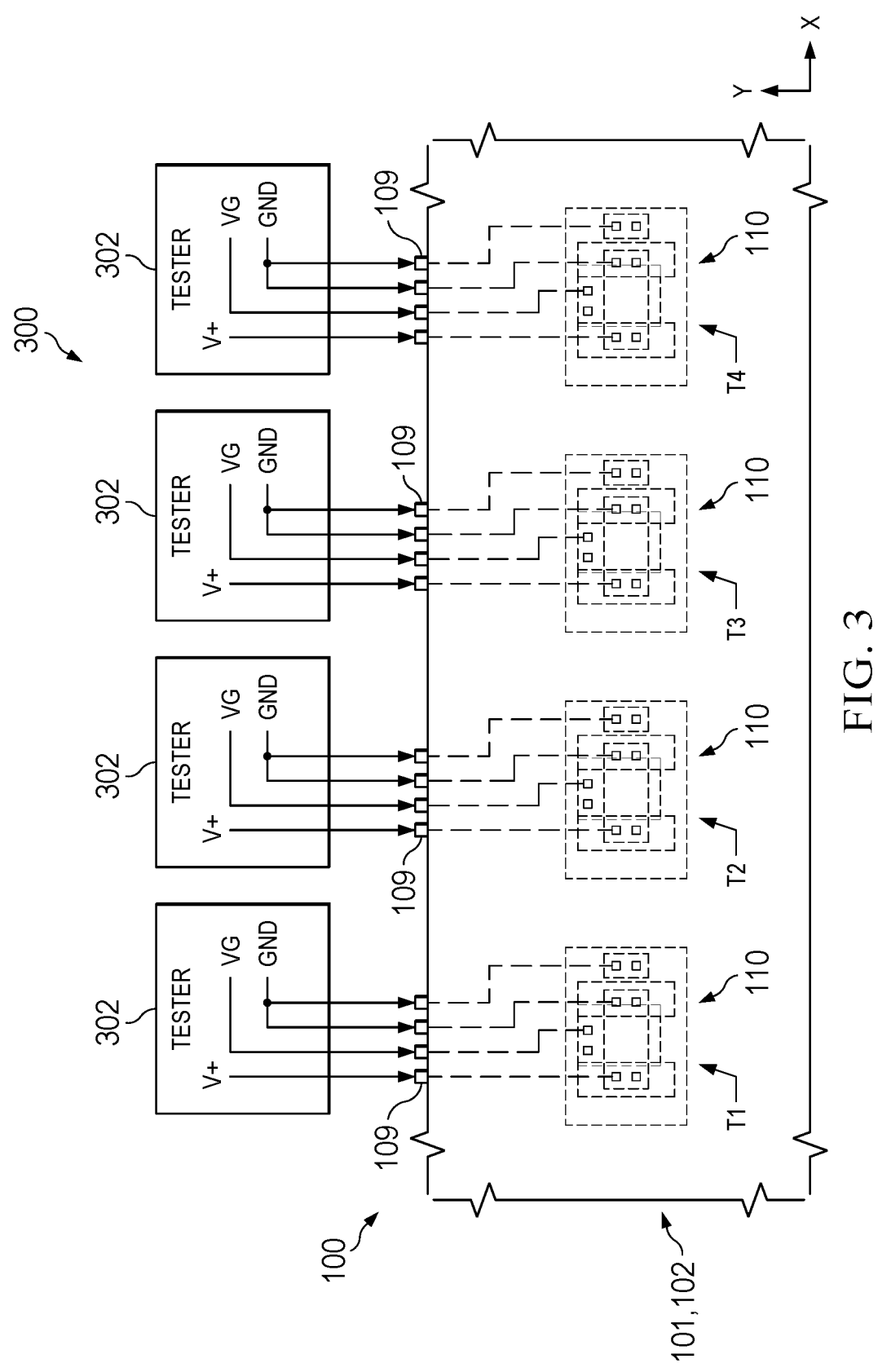
FIG. 3 is a partial top schematic view of a wafer fabrication system showing four transistor electrical components with different respective intentional gate polysilicon to lightly doped drain spacing distances along a first direction of the wafer undergoing a first wafer probe electrical test with a first drain source voltage polarity.
Figure 3A:
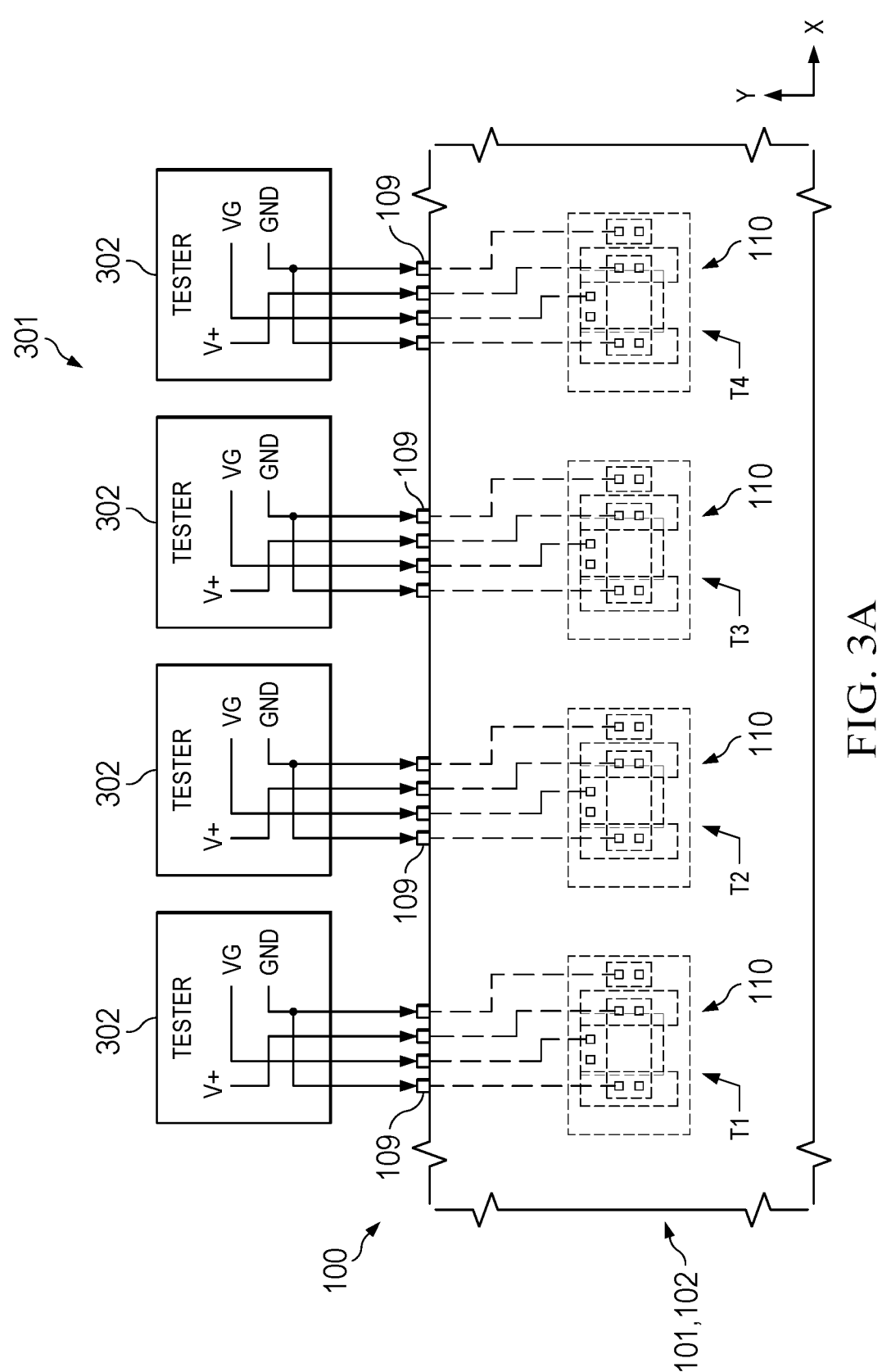
FIG. 3A is a partial top schematic view of the wafer fabrication system showing the four transistor electrical components along the first direction undergoing a second wafer probe electrical test with an opposite second drain source voltage polarity.
Figure 3B:
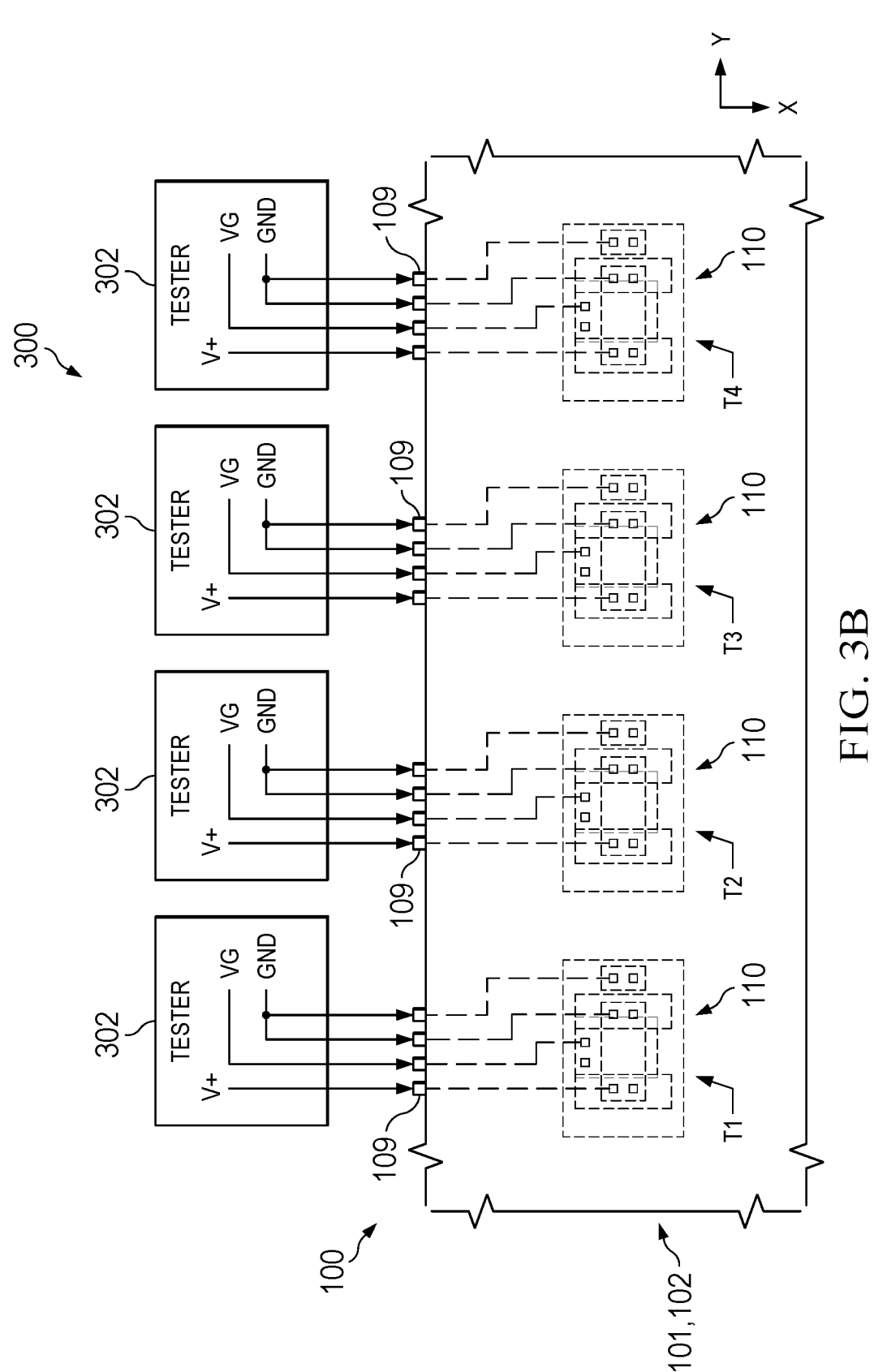
FIG. 3B is a partial top schematic view of a wafer fabrication system showing four transistor electrical components with different respective intentional gate polysilicon to lightly doped drain spacing distances along a second direction of the wafer undergoing a first wafer probe electrical test with a first drain source voltage polarity.
Figure 3C:
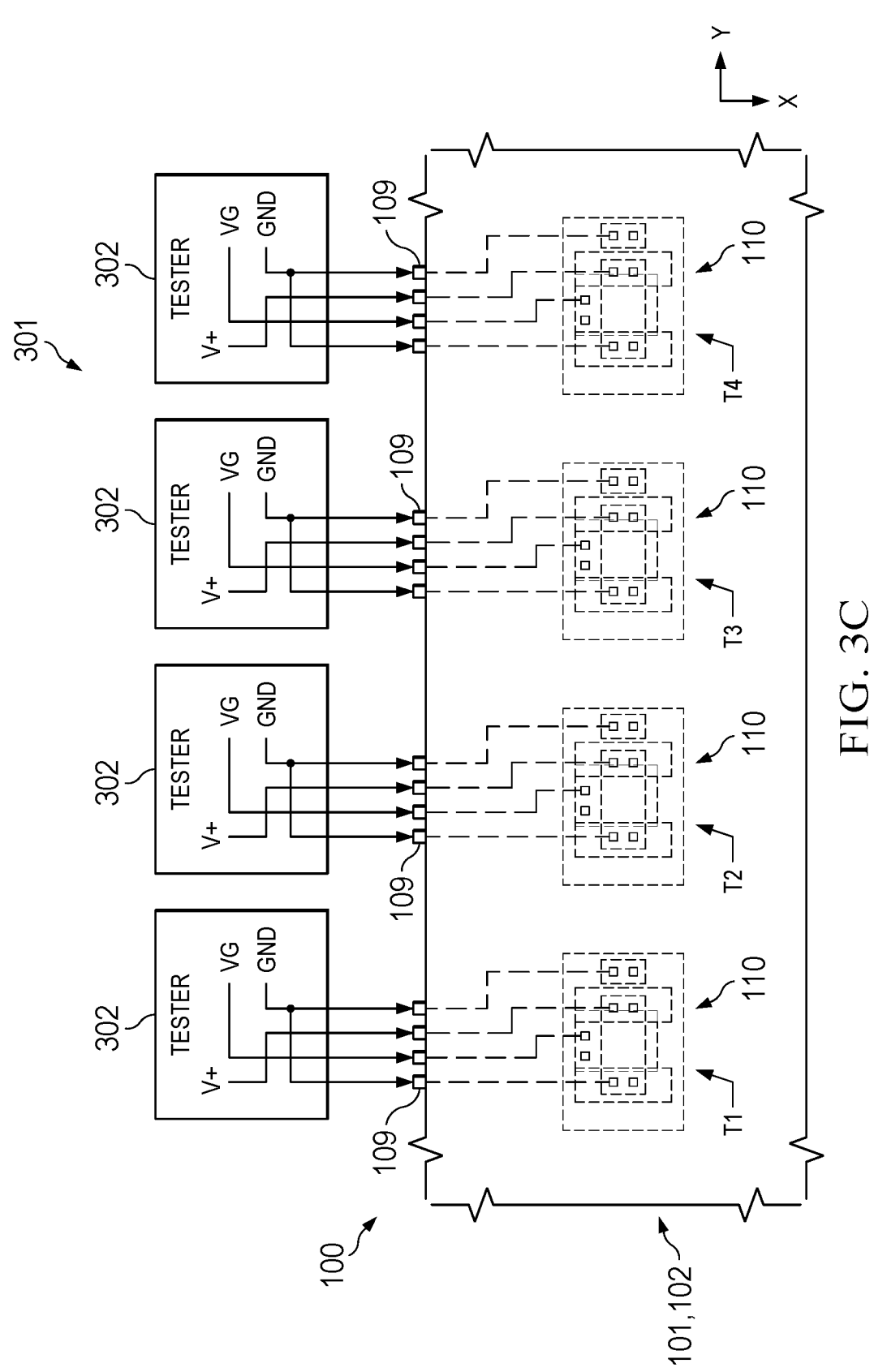
FIG. 3C is a partial top schematic view of the wafer fabrication system showing the four transistor electrical components along the second direction undergoing a second wafer probe electrical test with an opposite second drain source voltage polarity.
Figure 3D:
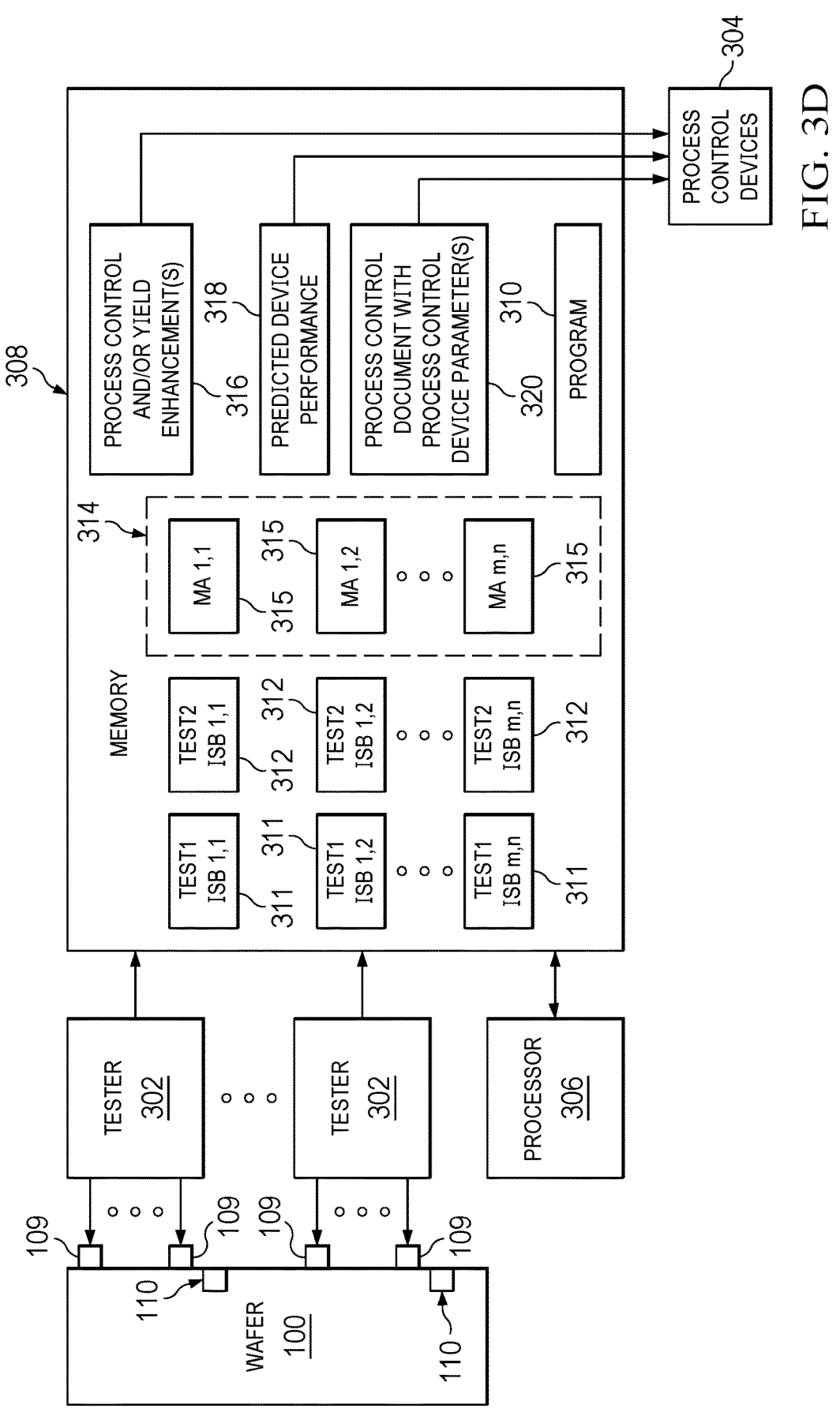
FIG. 3D is a schematic diagram of the wafer fabrication system with a correlation program that determines a misalignment distribution with misalignment values for the unit areas and/or scribe streets of the wafer based on the wafer probe electrical tests.
Figure 3E:
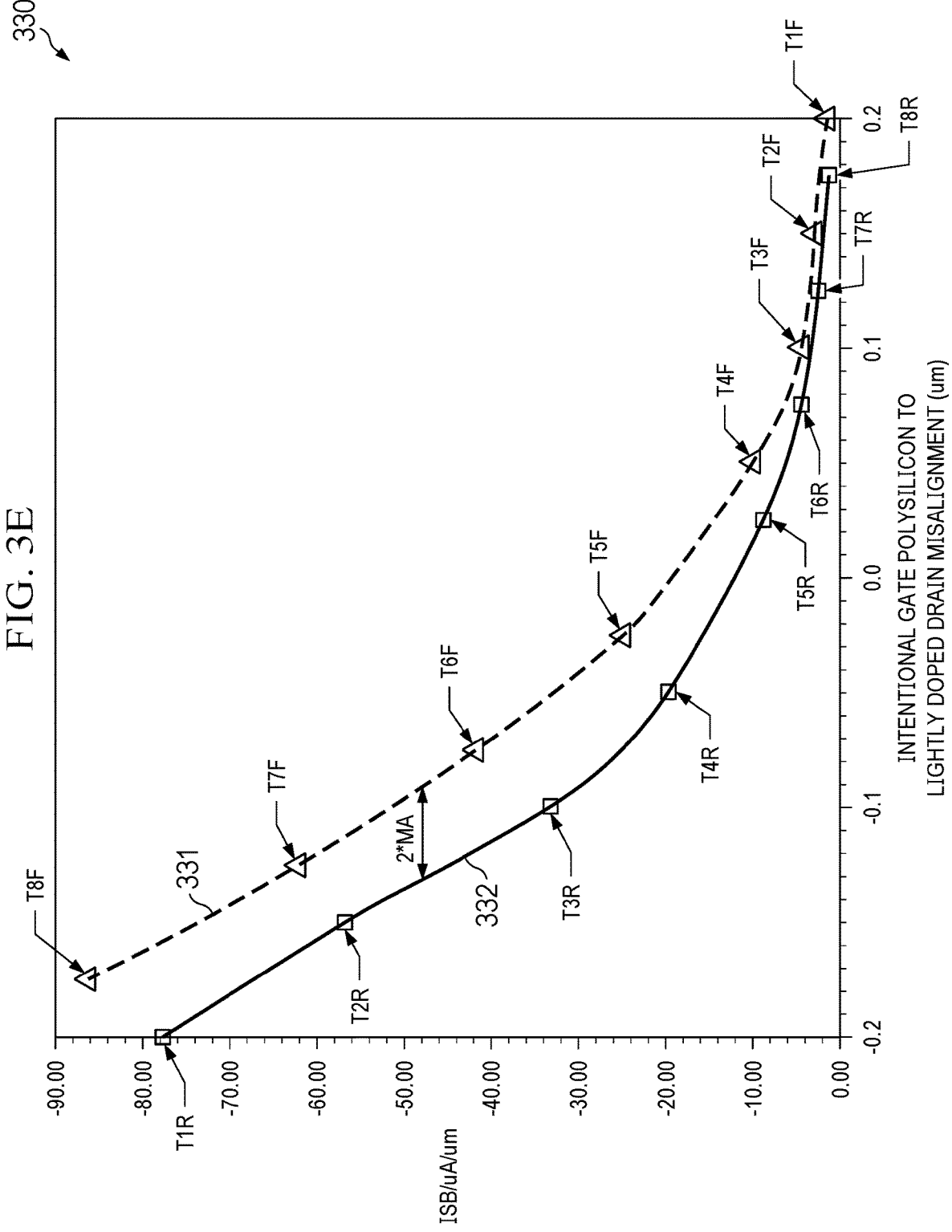
FIG. 3E is a graph of first and second measured substrate currents as a function of gate polysilicon to lightly doped drain misalignment and a computed misalignment for a unit area or scribe street of the wafer.

FIGS. 3-3E show one example, in which the substrate current electrical performance parameter ISB is tested in forward and reverse directions for each of eight instances (e.g., transistor instances T1-T8) of the transistor electrical component 110 along both the first and second directions X and Y of the intentional misalignment spacing distances at 204 in the unit areas 101 and in the scribe streets 102. In the example of FIGS. 3-3C, a first test 300 is performed that measures the substrate current ISB of the example transistor test components 110 for a forward source and drain voltage polarity (FIGS. 3 and 3B to assess misalignment effects on electrical performance along the respective first and second directions X and Y) and then a second electrical test 301 is performed at 204 to measure the transistor substrate current ISB of the transistor instances T1-T8 with reverse source and drain voltage polarity (e.g., FIGS. 3A and 3C). In this example, a tester 302 is positioned with probe pins engaging the wafer probe pads 109 to form electrical connections to the source S, drain D, gate G and back gate BG of each of the transistor instances.

In one implementation, the tester 302 concurrently probes and tests each transistor of a given set of intentionally misaligned transistor instances T1-T8 in a respective unit area 101 or scribe street 102 along both the first and second directions X and Y with a positive drain source voltage (e.g., FIGS. 3 and 3B with a positive test voltage V+ applied to the transistor drain, a gate control voltage VG applied to the transistor gate, and a ground or reference voltage GND applied to the transistor source and back gate) and then concurrently tests each transistor of the given set of intentionally misaligned transistor instances T1-T8 in the respective unit area 101 or scribe street 102 along both the first and second directions X and Y with a reversed drain source voltage (e.g., FIGS. 3A and 3C with the positive test voltage V+ applied to the transistor source, the gate control voltage VG applied to the transistor gate, and the ground or reference voltage GND applied to the transistor drain and back gate), before being disengaged and repositioned to probe and test another unit area 101 and/or scribe street 102 of the wafer 100. In this or another example, the tester 302 can form the suitable electrical connections individually and/or using shared wafer probe pads (e.g., FIG. 1L above). In other examples, the tester 302 can concurrently probe and test more than one unit area 101 and/or scribe street 102, with a first test measuring the substrate current ISB responsive to a first drain source signal voltage polarity and a second test measuring the substrate current ISB responsive to an opposite drain source signal voltage polarity.

FIG. 3D shows further details of a wafer fabrication system with one or more instances of the tester 302 that selectively engages or probes wafer probe pads 109 of a processed wafer 100. The system includes one or more process control devices 304 and one or more processing components 306 (e.g., processors, actuators, wafer fabrication systems and components, etc.) operatively coupled to an electronic memory 308. The memory 308 stores a correlation program 310 with computer executable program instructions that are executable by the processor 306 to perform wafer probe testing to implement all or part of the method 200 of FIG. 2, including automated probing and electrical testing of the instances of the transistor electrical component 110 of the tested wafer 100. In operation, the tester 302 performs electrical tests (e.g., 204 in FIG. 2) and stores the electrical performance values 311 and 312 (e.g., ISB) measured during the respective first and second tests (e.g., forward and reverse applied drain source voltages) in the electronic memory 308. In the example of FIG. 3D, the memory 308 stores the electrical performance values 311 and 312 for an integer number m tested locations (e.g., unit areas 101 and/or scribe streets 102) of the wafer 100 for each of an integer number n tested electrical components 110 in each set in (e.g., n=8 in the illustrated example).

At 206 in FIG. 2, the method 200 in one example includes computing a wafer misalignment distribution at 206 based on the results of the electrical tests. In one example, a wafer probe test system determines a misalignment distance MA of the respective unit areas 101 and/or scribe streets 102 along the first direction X and/or the second direction Y based on the electrical performance parameter (e.g., ISB) of the tested electrical components 110 of the respective unit areas 101 or scribe streets 102. In one implementation, the processor 306 executes instructions of the program 310 to compute a wafer misalignment distribution, such as misalignment distance mapping 314 of misalignment distances 315 of the respective unit areas 101 or scribe streets 102 of the tested wafer 100 at 206. In one example, the processor 306 computes the misalignment distances 315 for each of the first and second directions X and Y for each unit area 101 and scribe street 102 based on the electrical performance values 311 and 312 stored in the memory 308, for example as a misalignment distance MA. For example, the intentional misalignment along the second direction Y of the transistor instance T1 in FIG. 1C above as a nominal value of 0.5*(D11−D1), and a process variation can cause additional misalignment of the various features of the transistor instance T1, resulting in an unintended misalignment distance MA for a particular instance of the transistor electrical component 110 at a particular location of the wafer 100.

The misalignment mapping 314 provides numeric distribution of misalignment amounts attributable to process variations during fabrication of the processed wafer 100 along the first direction X as well as along the second direction Y for each of the corresponding locations of the respective unit areas 101 and scribe streets 102. This provides useful information for adjusting the wafer fabrication process as well as the process control devices 304 used in fabricating the wafer 100. In addition, the misalignment mapping 314 and the underlying misalignment distances 315 can be used in assessing device performance based on wafer misalignment and/or to update process control documents with process control device parameters based on wafer misalignment.

In one example, the method 200 further includes adjusting one or more process control and/or yield determinations based on the wafer misalignment distribution at 208, for example, adjusting a process control parameter of the fabrication process based on the misalignment distances 315 of the respective unit areas 101 or scribe streets 102 of the wafer 100 at 208. In the illustrated example, the processor 306 stores process control and/or yield adjustments 316 in the electronic memory 308 (FIG. 3D), and provides these to one or more process control devices 304, for example, for use in processing subsequent wafers based on the determined misalignment distribution computed based on the wafer probe testing of the currently tested wafer 100.

In this or another example, the method 200 includes predicting device performance at 210 based on the wafer misalignment distribution of the mapping 314, for example, including predicting performance of a device of the respective unit areas 101 or scribe streets 102 based on the misalignment distances 315 of the respective unit areas 101 or scribe streets 102 of the wafer 100. In one implementation, the processor 306 stores one or more predicted device performance values 318 in the electronic memory 308 and provides these to one or more process control devices 304, for example, to facilitate identification of expected performance of individual dies subsequently separated (e.g., simulated) from the currently tested wafer 100 prior to packaging operations to create a packaged electronic devices (e.g., integrated circuits or ICs).

In these or another example, the method 200 includes creating one or more new process control documents at 212 with process control device parameters based on the wafer misalignment distribution of the mapping 314. In one example, the processor 306 (FIG. 3D) stores one or more updated process control documents 320 in the electronic memory 308 with process control device parameters and provides such to the process control devices 304.

FIG. 3E shows a graph 330 with respective first and second measured substrate current (ISB) curves 331 and 332 as a function of gate polysilicon to LDD misalignment and a computed misalignment MA for a unit area 101 or scribe street 102 of the wafer along one of the first and second directions X and Y. In this example, eight instances T1-T8 of the transistor electrical component 110 have different intentional gate polysilicon to LDD misalignment amounts in the first direction X, and the tester 302 performs forward and reverse drain source voltage electrical testing of the substrate current ISB in respective first and second tests during wafer probe testing of each transistor instance T1-T8. In the illustrated example, the first transistor instance T1 has the largest amount of intentional misalignment (e.g., (D11–D1)/2=0.2 μm in FIGS. 1C and 1E above), the second transistor instance T2 has a slightly smaller amount of intentional misalignment (e.g., (D12-D2)/2=0.15 μm in FIG. 1E), the third and fourth transistor instances T3 and T4 have successively smaller intentional misalignment distance amounts of 0.10 μm and 0.5 μm, respectively, and the remaining instances T5-T8 have successively higher misalignment distance amounts in the opposite direction of –0.5 μm, –1.0 μm, –1.5 μm, and –2.0 μm, respectively. In this example, the misalignment difference values (e.g., ΔMA12, ΔMA23, ΔMA34 . . . in FIG. 1E above) are approximately the same (e.g., 0.5 μm). In other implementations, different misalignments difference values can be used.

FIG. 3E illustrates the first curve 331 showing the substrate current measurement values 311 of the first test (e.g., labeled T1F, T2F, T3F, T4F, T5F, T6F, T7F, and T8F), and the second curve 332 shows the substrate current measurement values 312 of the first test (e.g., labeled T1R, T2R, T3R, T4R, T5R, T6R, T7R, and T8R). As shown in the graph 330 of FIG. 3E, the measured substrate current ISB of the first transistor instance T1 using a forward (e.g., positive) applied drain source voltage signal in the first test results in a first measured substrate current value labeled T1F, and the subsequent second test of the first transistor instance T1 (e.g., using a reversed (negative) applied drain source voltage signal) results in a second measured substrate current value labeled T1R in the graph 330. The measured substrate current ISB of the second transistor instance T2 using the forward applied drain source voltage signal in the first test results in the second measured substrate current value T2F, and the second test of the second transistor instance T2 using the reversed applied drain source voltage signal results in the second measured substrate current value T2R, and the graph 330 shows the remaining measured substrate current values for the other transistor instances T3-T8. The processor 306 in one example determines the misalignment distance MA attributable to wafer fabrication process variations at the corresponding location of the unit area 101 or scribe street 102 as half the horizontal axis difference between the first and second curves 331 and 332, for example, using any suitable curve fitting technique (e.g., interpolation, etc.) to fit the curves 331 and 332 to the measured value data 311 and 312. In one example, the processor 306 executes instructions of the correlation program 310 to determine eight individual misalignment values 315 in FIG. 3D (e.g., MA1,1, MA1,2, . . . , MAm,n) for each of the first and second directions X and Y for each unit area 101 and scribe street 102 based on the horizontal axis difference between the curves 331 and 332, for example, by averaging the horizontal axis differences between the curves 331 and 332 at two or more locations (e.g., for two or more corresponding substrate current values ISB). In one example, the real/unintentional misalignments are the same or approximately the same for the transistors T1-T8 in different test component sets in a single die location, as a single die/shot is exposed in lithography together. The real/unintentional misalignment information can be assessed at different die locations and variations across the wafer can be evaluated.

After completion of wafer probe testing, the method 200 in FIG. 2 continues at 214 with die singulation or separation that separates individual processed semiconductor dies (e.g., semiconductor die 141 in FIG. 1H above) from the processed semiconductor wafer 100, as well as packaging at 216 to create a packaged electronic device (e.g., device 130 in FIG. 1H). At 218 in FIG. 2, the method 200 continues with optional final device testing to test one or more performance parameters of the finished packaged electronic devices.

As further shown in FIG. 2, the example method 200 includes processing subsequent wafers (using the process control devices 304 in FIG. 3D) based on the new process control documents (e.g., process control documents 320 stored in the electronic memory 308), for example, using any suitable process control and/or yield adjustments 316.

Figure 4:
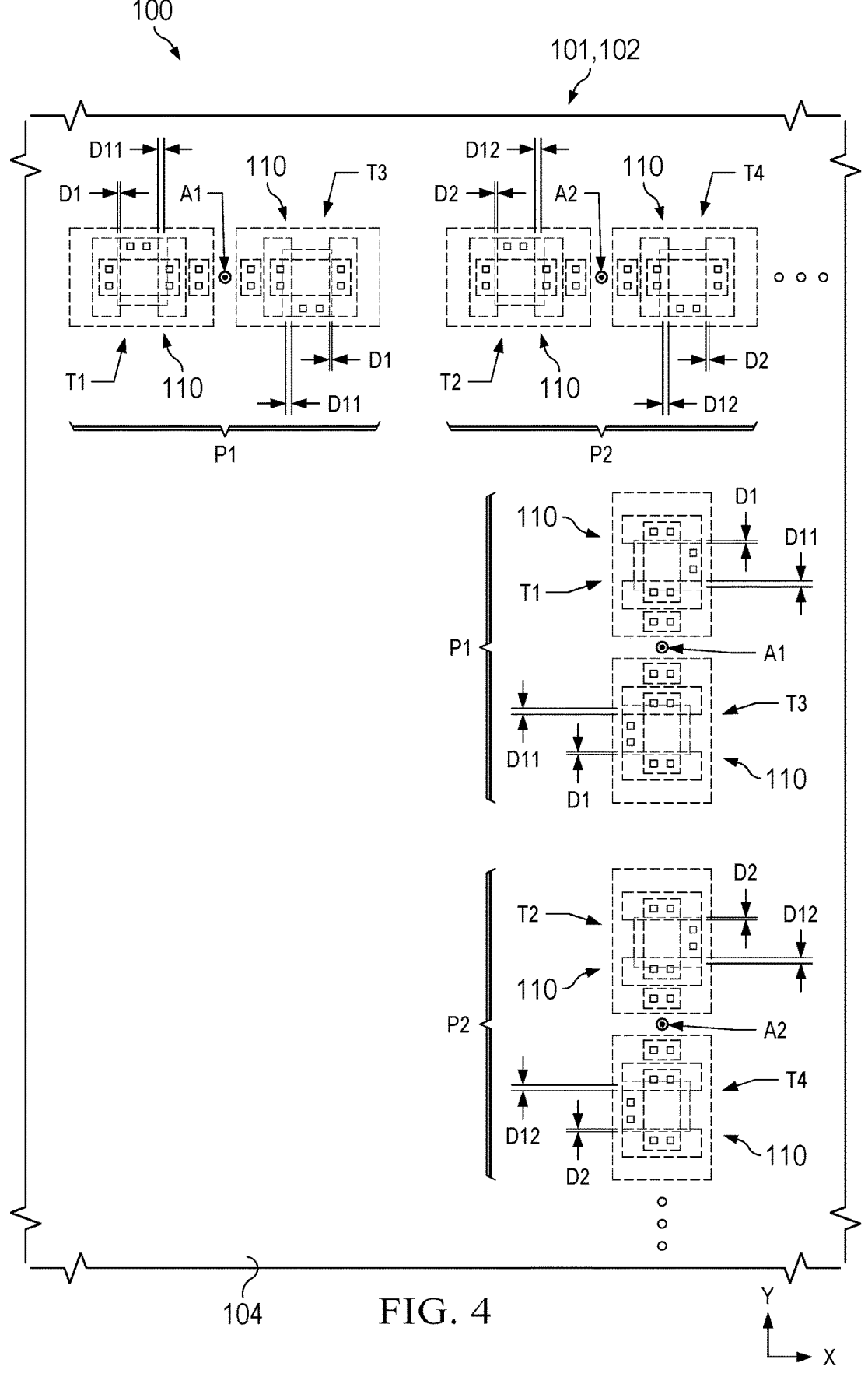
FIG. 4 is a partial top view of two pairs of 180 degree rotated transistor electrical components with the different respective intentional gate polysilicon to lightly doped drain spacing distances along a first direction, and two pairs of 180 degree rotated transistor electrical components with different respective intentional gate polysilicon to lightly doped drain spacing distances along an orthogonal second direction in a unit area of the wafer.
Figure 5:
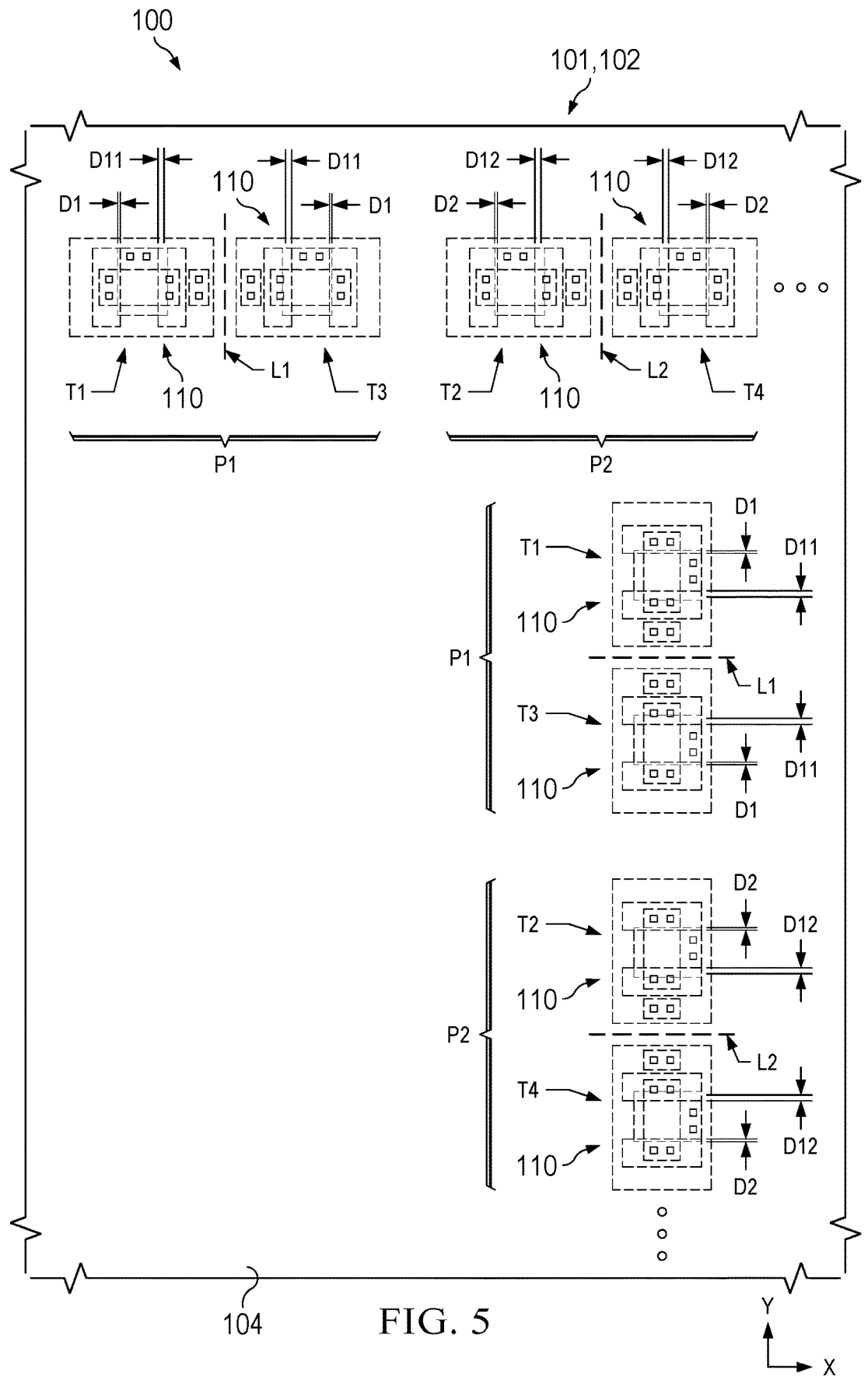
FIG. 5 is a partial top view of two pairs of mirrored transistor electrical components with the different respective intentional gate polysilicon to lightly doped drain spacing distances along a first direction, and two pairs of mirrored transistor electrical components with different respective intentional gate polysilicon to lightly doped drain spacing distances along an orthogonal second direction in a unit area of the wafer.
Figure 5A:
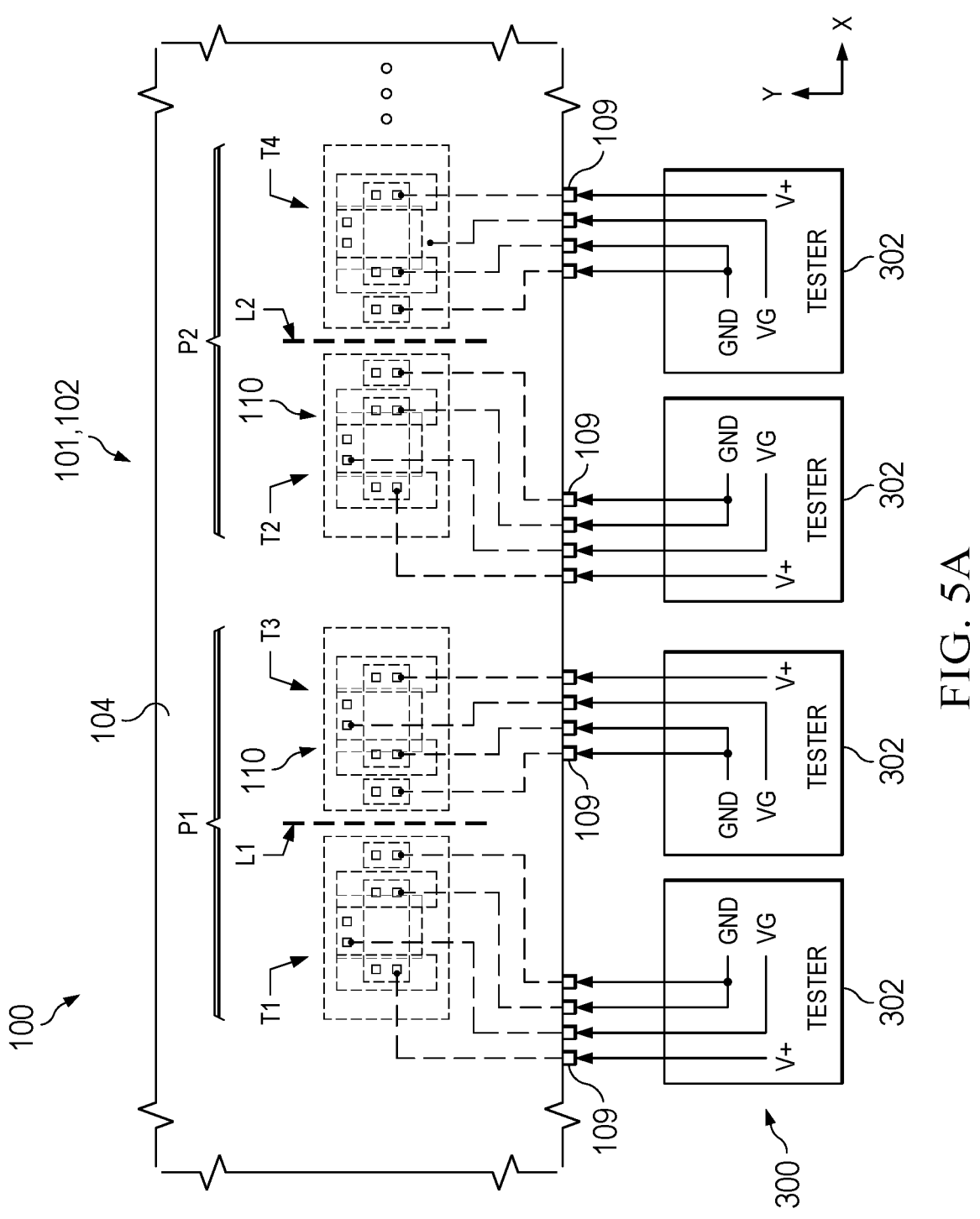
FIG. 5A is a partial top view of two pairs of mirrored transistor electrical components with the different respective intentional gate polysilicon to lightly doped drain spacing distances along the first direction and connections to wafer probe pads of the wafer.
Figure 5B:
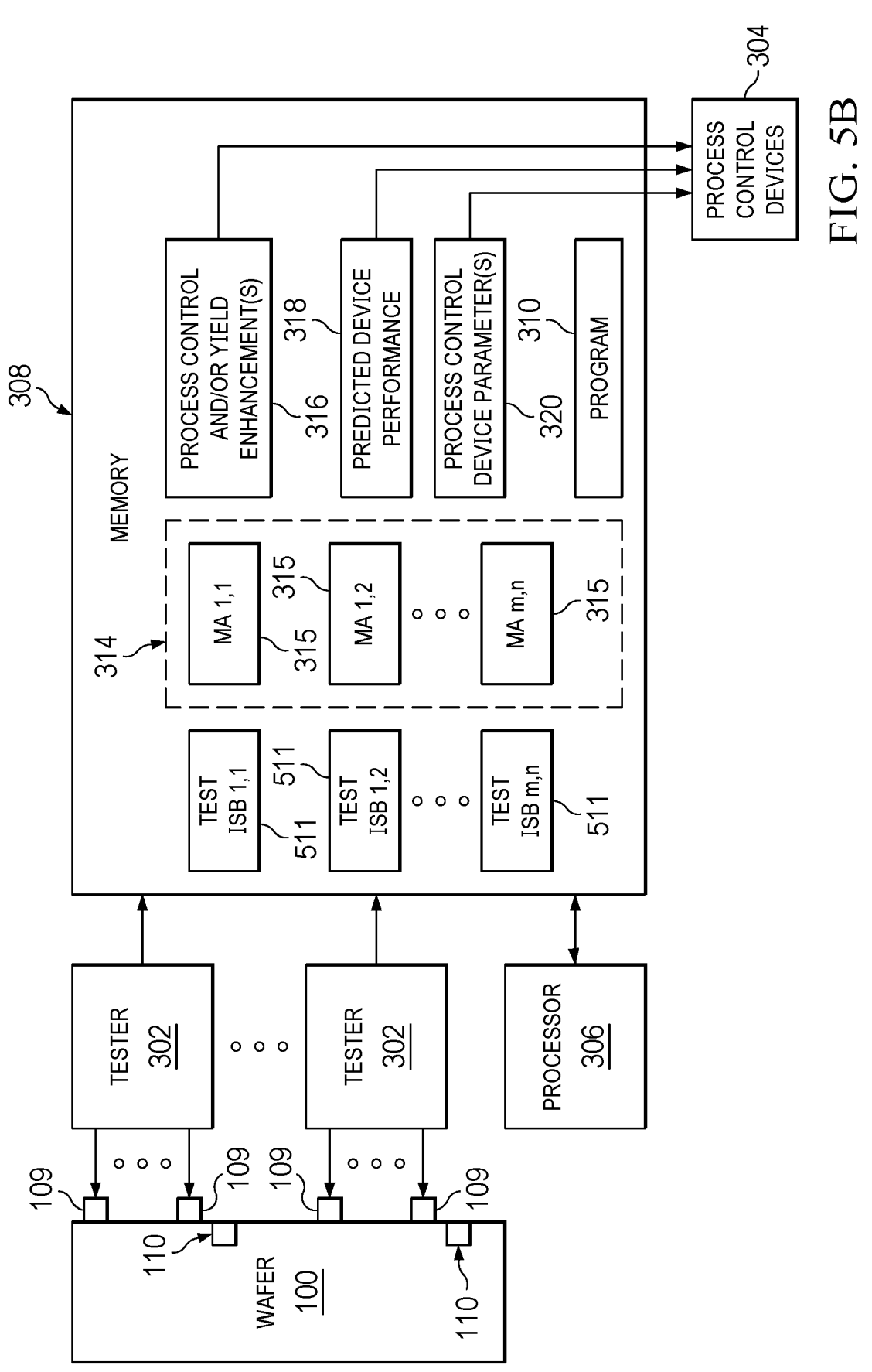
FIG. 5B is a schematic diagram of the wafer fabrication system with the correlation program that determines a misalignment distribution with misalignment values for the unit areas and/or scribe streets of the wafer based on the wafer probe electrical tests.
Figure 5C:
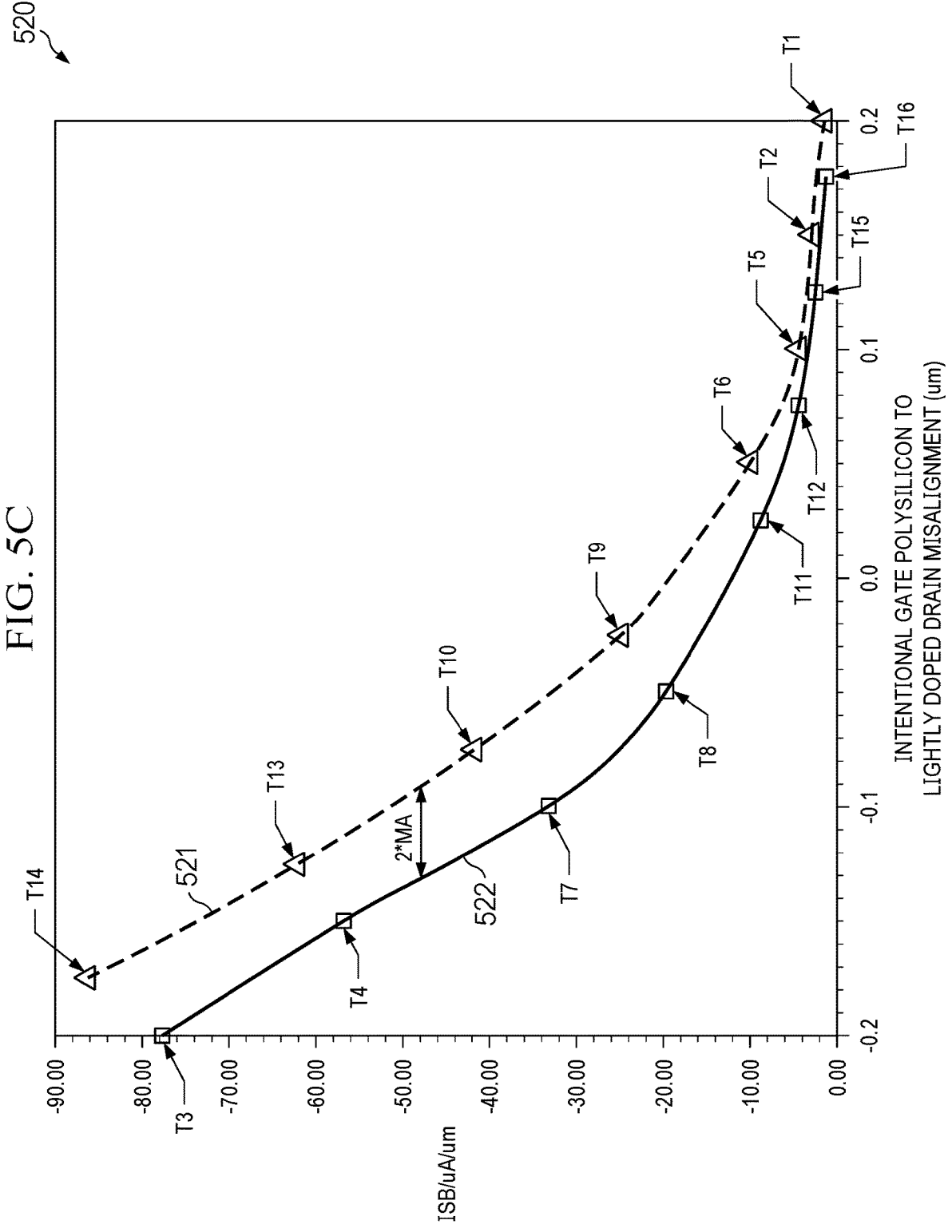
FIG. 5C is a graph of first and second measured substrate currents as a function of gate polysilicon to lightly doped drain misalignment and a computed misalignment for a unit area or scribe street of the wafer.

Referring also to FIGS. 4-5C, in further examples, multiple instances of mirrored or rotated pairs of electrical components 110 are formed at 204 and tested concurrently at 204 (e.g., as described further below in connection with FIGS. 4-5C). These examples can advantageously facilitate fabrication cost reduction by reducing wafer probe test times for each tested wafer 100.

Figure 4A:
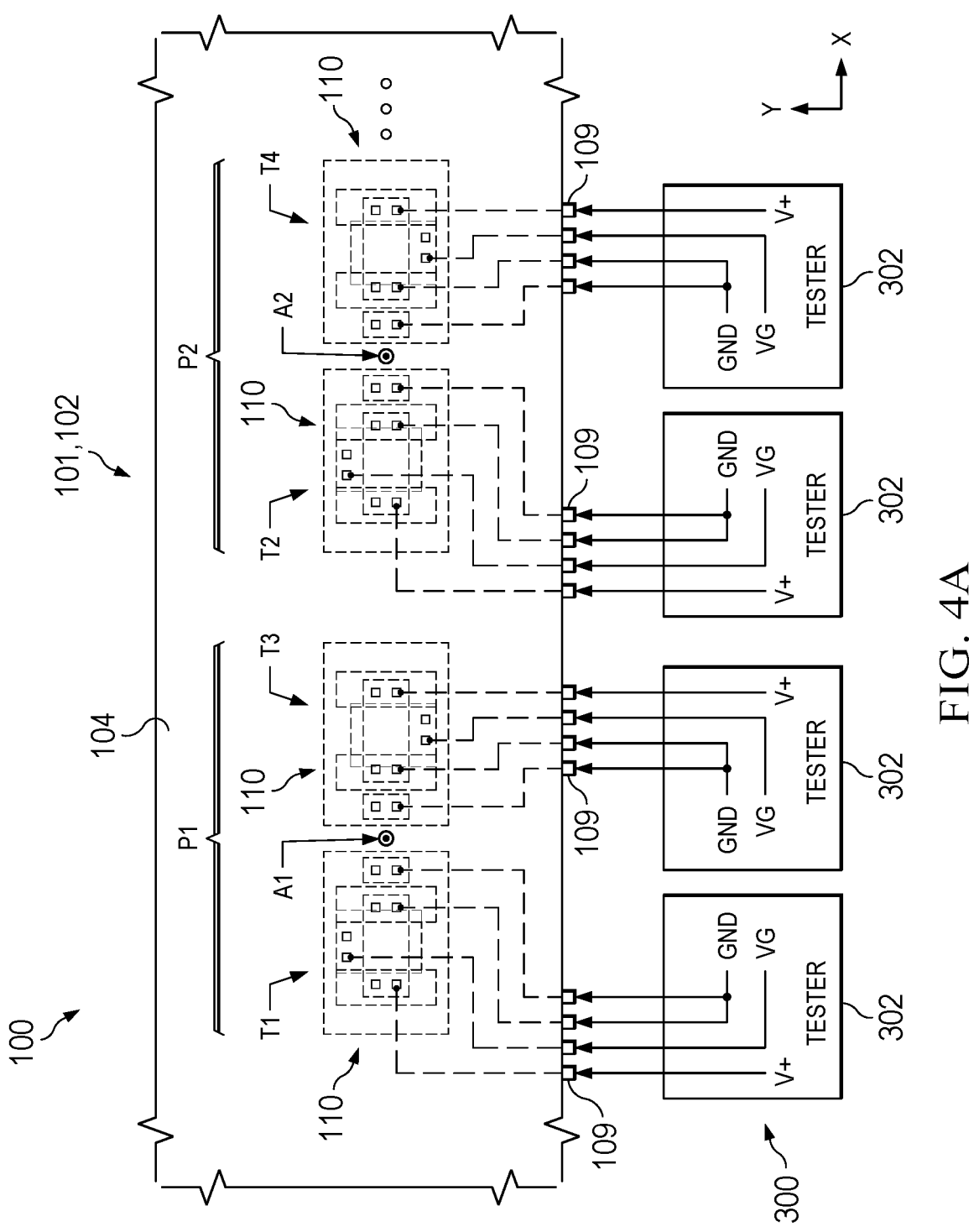
FIG. 4A is a partial top view of two pairs of 180 degree rotated transistor electrical components with the different respective intentional gate polysilicon to lightly doped drain spacing distances along the first direction and connections to wafer probe pads of the wafer.
Figure 4B:
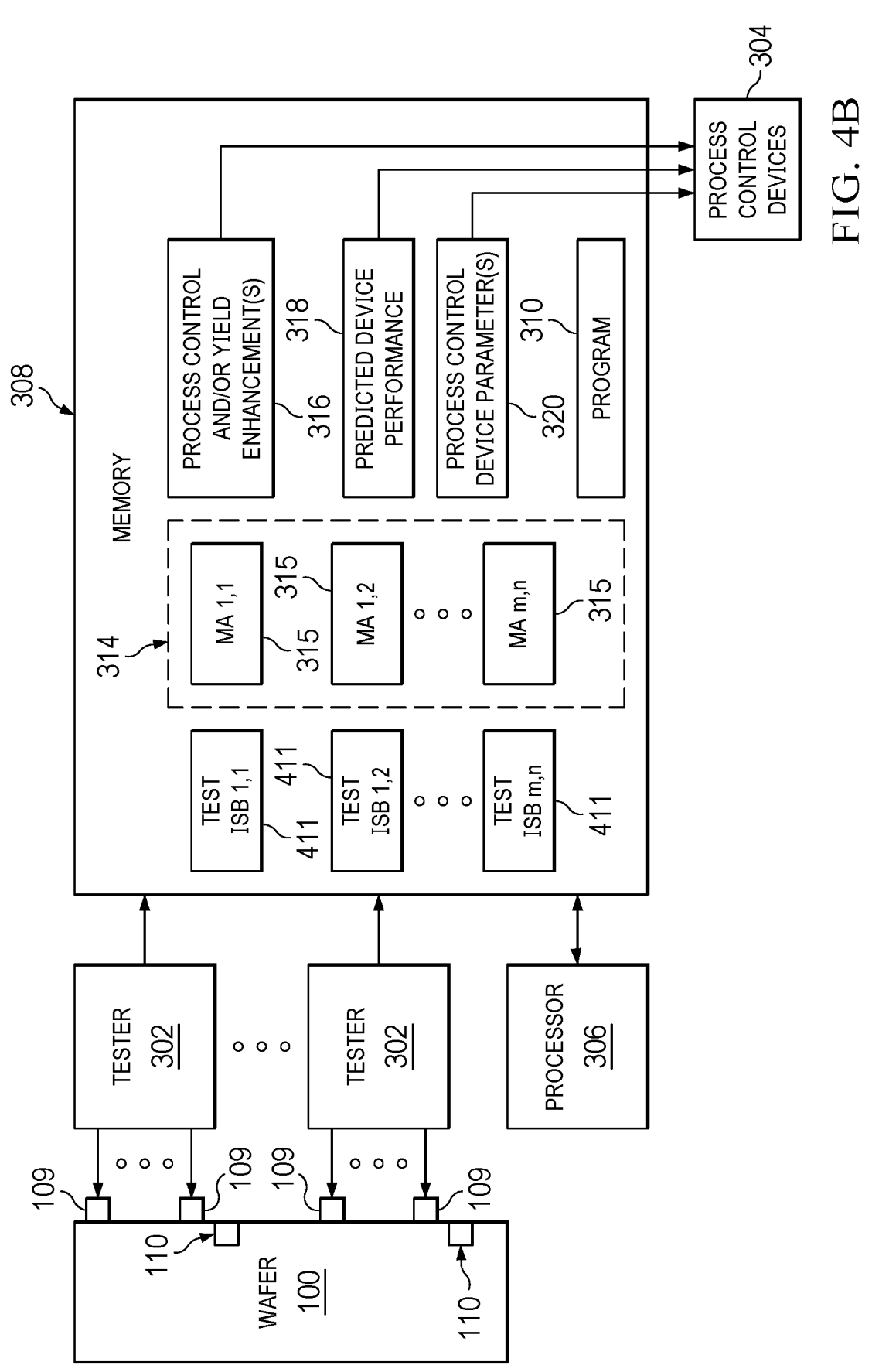
FIG. 4B is a schematic diagram of the wafer fabrication system with the correlation program that determines a misalignment distribution with misalignment values for the unit areas and/or scribe streets of the wafer based on the wafer probe electrical tests.
Figure 4C:
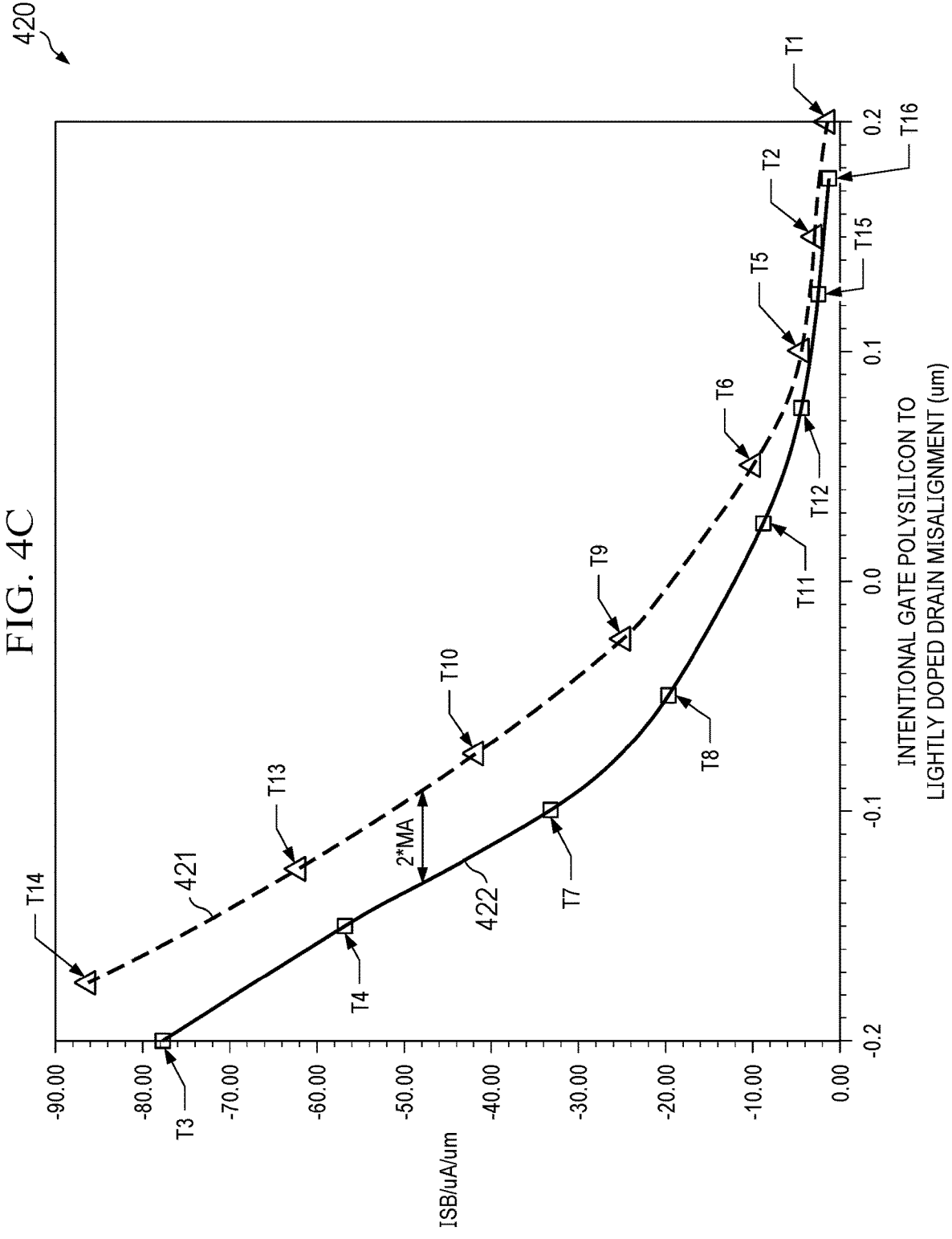
FIG. 4C is a graph of first and second measured substrate currents as a function of gate polysilicon to lightly doped drain misalignment and a computed misalignment for a unit area or scribe street of the wafer.

FIGS. 4-4C illustrate one implementation using substantially similar but rotated instances of the transistor electrical component 110 formed in eight or other suitable number of pairs P1, P2, . . . along either or both of the respective first and second directions X and Y. FIG. 4 shows an example portion of a unit area 101 or scribe street 102 of the wafer 100 with multiple pairs of similar instances of transistor electrical component 110. The illustrated portion shows two pairs P1 and P2 of 180 degree rotated transistor electrical component instances with the different respective intentional gate polysilicon to lightly doped drain spacing distances along the first direction X, as well as two pairs P1 and P2 of 180 degree rotated transistor electrical components with different respective intentional gate polysilicon to lightly doped drain spacing distances along the second direction Y in a unit area 101 or scribe street 102 of the wafer 100. In one implementation, each unit area 101 and scribe street 102 includes two sets of eight such pairs spaced apart from one another and having different amounts of intentional spacing distance misalignment along the respective first and second directions X and Y. The first pair P1 of the sets along the respective first and second directions X and Y includes a first instance T1 of the transistor electrical component 110 and the second pair P2 includes a second instance T2 of the transistor electrical component 110, where the transistor instances T1 and T2 have different respective gate polysilicon to lightly doped drain spacing distances D1 and D2 (as well as D11 and D12). The first pair P1 includes a third instance T3 of the transistor electrical component 110 having the same corresponding spacing distances D1 and D11 as the first instance T1, but the third instance T3 is rotated 1800 about a first axis A1 along the third direction (e.g., out of the page in the view of FIG. 4). The second pair P2 includes a fourth instance T3 of the transistor electrical component 110 having the same corresponding spacing distances D2 and D12 as the second instance T2, but the fourth instance T4 is rotated 180° about a second axis A2 along the third direction.

FIG. 4A shows the two pairs P1 and P2 of 180 degree rotated instances of the transistor electrical components 110 with the different respective intentional gate polysilicon to lightly doped drain spacing distances D1, D11 and D2, D12 along the first direction X along with connections of the tester 302 to wafer probe pads 109 of the wafer 100. As shown in FIG. 4A, the tester 302 applies positive drain source voltage signals to the rotated transistor pairs in a single test and obtains corresponding substrate current measurements ISD. As further shown in FIG. 4B, the processor 306 stores the measurement values 411 in the electronic memory 308 of the system and computes the wafer misalignment distribution, such as the misalignment distance mapping 314 of misalignment distances 315 of the respective unit areas 101 or scribe streets 102 of the tested wafer 100, which are stored in the memory 308 along with the process control and/or yield adjustments 316, the predicted device performance values 318, and the updated process control documents 320 as described above.

FIG. 4C shows a graph 420 with respective first and second measured substrate current curves 421 and 422 as a function of gate polysilicon to lightly doped drain misalignment and a computed misalignment MA for a unit area 101 or scribe street 102 of the wafer along one of the first and second directions X and Y. In this example, eight pair instances P1-P8 of the transistor electrical component 110 have different respective intentional gate polysilicon to LDD misalignment amounts in the first direction X and in the second direction Y. The tester 302 performs concurrent drain source voltage electrical testing of the substrate current ISB in a single test during wafer probe testing of each transistor pair instance. In the illustrated example, the first transistor instance pair T1, T3 has the largest amount of intentional misalignment (e.g., (D11–D1)/2=0.2 μm in FIGS. 4 and 4C), the second transistor instance pair T2, T4 has a slightly smaller amount of intentional misalignment (e.g., (D12–D2)/2=0.15 μm), the third and fourth transistor instance pairs T5, T7 and T6, T8 have successively smaller intentional misalignment distance amounts of 0.10 μm and 0.5 μm, respectively, and the remaining instance pairs (T9, T11; T10, T12; T13, T15; and T14, T16 have successively higher misalignment distance amounts in the opposite direction of –0.5 μm, –1.0 μm, –1.5 μm, and –2.0 μm, respectively. In this example, the misalignment difference values are approximately the same (e.g., 0.5 μm). In other implementations, different misalignments difference values can be used.

The first curve 421 in FIG. 4C shows the substrate current measurement values 411 of non-rotated transistor instances (e.g., labeled T1, T2, T5, T6, T9, T10, T13, and T14), and the second curve 422 shows the substrate current measurement values 411 of the rotated instances (e.g., labeled T3, T4, T7, T8, T11, T12, T15, and T16). The measured substrate current ISB of the first transistor instance pair T1, T3 results in measured substrate current values labeled T1, T3. The measured substrate current ISB of the second transistor instance pair results in the second measured substrate current values T2 and T4, and the graph 420 shows the remaining measured substrate current values for the other transistor instance pairs. The processor 306 in one example determines the misalignment distance MA attributable to wafer fabrication process variations at the corresponding location of the unit area 101 or scribe street 102 as half the horizontal axis difference between the first and second curves 421 and 422, for example, using any suitable curve fitting technique (e.g., interpolation, etc.) to fit the curves 421 and 422 to the measured value data 411. In one example, the processor 306 executes instructions of the correlation program 310 to determine eight individual misalignment values 315 in FIG. 3D (e.g., MA1,1, MA1,2, . . . , MAm,n) and determines the resulting misalignment distances 315 for each of the first and second directions X and Y for each unit area 101 and scribe street 102 based on the horizontal axis difference between the curves 421 and 422, for example, by averaging the horizontal axis differences between the curves 421 and 422 at two or more locations (e.g., for two or more corresponding substrate current values ISB).

FIGS. 5-5C show another implementation using substantially similar pairs of transistor electrical component instances reflected (e.g., mirrored) about a corresponding line L1, L2 with the different respective intentional gate polysilicon to lightly doped drain spacing distances along a first direction X, and pairs of reflected transistor electrical components with different respective intentional gate polysilicon to lightly doped drain spacing distances along the second direction Y in a unit area 101 or scribe street 102 of the wafer 100. The implementation of FIGS. 5-5C uses substantially similar but reflected instances of the transistor electrical component 110 formed in eight or other suitable number of pairs P1, P2, . . . along either or both of the respective first and second directions X and Y. FIG. 5 shows an example portion of a unit area 101 or scribe street 102 of the wafer 100 with multiple mirrored pairs of similar instances of such transistor electrical component 110. The illustrated portion shows two pairs P1 and P2 of mirrored transistor electrical component instances reflected about respective lines L1 and L2 that extend along the second direction Y with the different respective intentional gate polysilicon to lightly doped drain spacing distances along the first direction X, as well as two pairs P1 and P2 of mirrored transistor electrical component instances with different respective intentional gate polysilicon to lightly doped drain spacing distances along the second direction Y in a unit area 101 or scribe street 102 of the wafer 100. In one implementation, each unit area 101 and scribe street 102 includes two sets of eight such mirrored component pairs spaced apart from one another and having different amounts of intentional spacing distance misalignment along the respective first and second directions X and Y.

The first pair P1 of the sets along the respective first and second directions X and Y includes a first instance T1 of the transistor electrical component 110 and the second pair P2 includes a second instance T2 of the transistor electrical component 110, where the transistor instances T1 and T2 have different respective gate polysilicon to lightly doped drain spacing distances D1 and D2 (as well as D11 and D12). The first pair P1 includes a third instance T3 of the transistor electrical component 110 having the same corresponding spacing distances D1 and D11 as the first instance T1, but the third instance T3 is reflected about the first line L1 along the second direction Y. The second pair P2 includes a fourth instance T3 of the transistor electrical component 110 having the same corresponding spacing distances D2 and D12 as the second instance T2, but the fourth instance T4 is reflected about the second line L2.

FIG. 5A shows the two pairs P1 and P2 of 180 degree reflected or mirrored instances of the transistor electrical components 110 with the different respective intentional gate polysilicon to lightly doped drain spacing distances D1, D11 and D2, D12 along the first direction X along with connections of the tester 302 to wafer probe pads 109 of the wafer 100. As shown in FIG. 5A, the tester 302 applies positive drain source voltage signals to the reflected transistor pairs in a single test and obtains corresponding substrate current measurements ISD. As further shown in FIG. 5B, the processor 306 stores the measurement substrate current values 511 in the electronic memory 308 of the system and computes the wafer misalignment distribution, such as the misalignment distance mapping 314 of misalignment distances 315 of the respective unit areas 101 or scribe streets 102 of the tested wafer 100, which are stored in the memory 308 along with the process control and/or yield adjustments 316, the predicted device performance values 318, and the updated process control documents 320 as described above.

FIG. 5C shows a graph 520 with respective first and second measured substrate current curves 521 and 522 as a function of gate polysilicon to lightly doped drain misalignment and a computed misalignment MA for a unit area 101 or scribe street 102 of the wafer 100 along one of the first and second directions X and Y. In this example, eight pair instances P1-P8 of the transistor electrical component 110 have different respective intentional gate polysilicon to LDD misalignment amounts in the first direction X and in the second direction Y.

The tester 302 performs concurrent drain source voltage electrical testing of the substrate current ISB in a single test during wafer probe testing of each transistor pair instance. In the illustrated example, the first transistor instance pair T1, T3 has the largest amount of intentional misalignment (e.g., (D11–D1)/2=0.2 μm in FIGS. 5 and 5C), the second transistor instance pair T2, T4 has a slightly smaller amount of intentional misalignment (e.g., (D12–D2)/2=0.15 μm), the third and fourth transistor instance pairs T5, T7 and T6, T8 have successively smaller intentional misalignment distance amounts of 0.10 μm and 0.5 μm, respectively, and the remaining instance pairs (T9, T11; T10, T12; T13, T15; and T14, T16 have successively higher misalignment distance amounts in the opposite direction of –0.5 μm, –1.0 μm, –1.5 μm, and –2.0 μm, respectively. In this example, the misalignment difference values are approximately the same (e.g., 0.5 μm). In other implementations, different misalignments difference values can be used.

The first curve 521 in FIG. 5C shows the substrate current measurement values 511 of non-rotated transistor instances (e.g., labeled T1, T2, T5, T6, T9, T10, T13, and T14), and the second curve 522 shows the substrate current measurement values 511 of the rotated instances (e.g., labeled T3, T4, T7, T8, T11, T12, T15, and T16). The measured substrate current ISB of the first transistor instance pair T1, T3 results in measured substrate current values labeled T1, T3. The measured substrate current ISB of the second transistor instance pair results in the second measured substrate current values T2 and T4, and the graph 520 shows the remaining measured substrate current values for the other transistor instance pairs. The processor 306 in one example determines the misalignment distance MA attributable to wafer fabrication process variations at the corresponding location of the unit area 101 or scribe street 102 as half the horizontal axis difference between the first and second curves 521 and 522, for example, using any suitable curve fitting technique (e.g., interpolation, etc.) to fit the curves 521 and 522 to the measured value data 511. In one example, the processor 306 executes instructions of the correlation program 310 to determine eight individual misalignment values 315 in FIG. 3D (e.g., MA1,1, MA1,2, . . . , MAm,n) and determines the resulting misalignment distances 315 for each of the first and second directions X and Y for each unit area 101 and scribe street 102 based on the horizontal axis difference between the curves 521 and 522, for example, by averaging the horizontal axis differences between the curves 521 and 522 at two or more locations (e.g., for two or more corresponding substrate current values ISB).

Modifications are possible in the described examples, and other implementations are possible, within the scope of the claims.

What is claimed is:

1. An electronic device, comprising:
   a device die including a semiconductor substrate having a side that extends in a plane of orthogonal first and second directions;
   a first rotationally asymmetric electrical component including first and second structural features formed in or over the semiconductor substrate, the first structural feature in the first electrical component spaced apart from the second structural feature in the first electrical component by a first spacing distance; and
   a second rotationally asymmetric electrical component nominally identical to the first electrical component and including the first and the second structural features formed in or over the semiconductor substrate, the first structural feature in the second electrical component spaced apart from the second structural feature in the second electrical component by the first spacing distance, the second electrical component rotated with respect to the first electrical component.

2. The electronic device of claim 1, wherein the first and second electrical components are transistors and the first spacing distance is gate polysilicon to lightly doped drain spacing distances along the first direction.

3. The electronic device of claim 1, wherein the first and second electrical components are transistors and the first spacing distance is gate polysilicon to source/drain contact spacing distances.

4. The electronic device of claim 1, wherein the first and second electrical components are transistors and the first spacing distance is shallow well edge to moat edge spacing distances.

5. The electronic device of claim 1, wherein the first and second electrical components are transistors and the first spacing distance is source/drain contact to moat edge spacing distances.

6. The electronic device of claim 1, wherein the first and second electrical components are located in a scribe street of the device die.

7. A method, comprising:
   forming an integrated circuit over and extending into a semiconductor substrate and including a device active region surrounded by a scribe seal;
   forming a first rotationally asymmetric electrical component including first and second structural features in or over the semiconductor substrate, the first structural feature in the first electrical component spaced apart from the second structural feature in the first electrical component by a first spacing distance; and
   forming a second rotationally asymmetric electrical component nominally identical to the first electrical component and including the first and the second structural features formed in or over the semiconductor substrate, the first structural feature in the second electrical component spaced apart from the second structural feature in the second electrical component by the first spacing distance, the second electrical component rotated with respect to the first electrical component.

8. The method of claim 7, wherein the first and second electrical components are located in the device active region.

9. The electronic device of claim 1, comprising:
   a third electrical component including the first and the second structural features formed in or over the semiconductor substrate, the first structural feature in the third electrical component spaced apart from the second structural feature in the third electrical component by a second spacing distance different from the first spacing distance; and
   a fourth electrical component nominally identical to the third electrical component and including the first and the second structural features formed in or over the semiconductor substrate, the first structural feature in the third electrical component spaced apart from the second structural feature in the third electrical component by the second spacing distance, the fourth electrical component rotated with respect to the third electrical component.

10. The electronic device of claim 1, wherein the second electrical component is rotated 180° with respect to the first electrical component.

11. The electronic device of claim 1, wherein the first electrical component is configured to be biased in the first direction, and the second electrical component is configured to be biased in a third direction opposite the first direction.

12. The method of claim 7, wherein the first and second electrical components are transistors and the first spacing distance is gate polysilicon to lightly doped drain spacing distance.

13. The method of claim 7, wherein the first and second electrical components are transistors and the first spacing distance is gate polysilicon to source/drain contact spacing distances.

14. The method of claim 7, wherein the first and second electrical components are transistors and the first spacing distance is shallow well edge to moat edge spacing distances.

15. The method of claim 7, wherein the first and second electrical components are transistors and the first spacing distance is source/drain contact to moat edge spacing distances.

16. An electronic device, comprising:
   a device die including a semiconductor substrate;
   a first electrical component including first and second structural features formed in or over the semiconductor substrate, the first structural feature in the first electrical component spaced apart from the second structural feature in the first electrical component by a first spacing distance, the first electrical component having first terminals spaced apart along an axis; and
   a second electrical component nominally identical to the first electrical component and including the first and the second structural features formed in or over the semiconductor substrate, the first structural feature in the second electrical component spaced apart from the second structural feature in the second electrical component by the first spacing distance, the second electrical component having second terminals spaced apart along the axis,
   wherein the first electrical component is configured to be biased between the first terminals in a first direction along the axis, and the second electrical component is configured to be biased between the second terminals in a second opposite direction along the axis.

17. The electronic device of claim 16, comprising:
   a third electrical component including the first and the second structural features formed in or over the semiconductor substrate, the first structural feature in the third electrical component spaced apart from the second structural feature in the third electrical component by a second spacing distance different from the first spacing distance, the third electrical component having third terminals spaced apart along the axis; and
   a fourth electrical component nominally identical to the third electrical component and including the first and the second structural features formed in or over the semiconductor substrate, the first structural feature in the third electrical component spaced apart from the second structural feature in the third electrical component by the second spacing distance, the fourth electrical component rotated with respect to the third electrical component, the fourth electrical component having fourth terminals spaced apart along the axis,
   wherein the third electrical component is configured to be biased between the third terminals in the first direction, and the second electrical component is configured to be biased between the fourth terminals in the second direction.

* * * * *